United States Patent
Bernhardt

(10) Patent No.: US 7,402,821 B2
(45) Date of Patent: Jul. 22, 2008

(54) APPLICATION OF DIGITAL FREQUENCY AND PHASE SYNTHESIS FOR CONTROL OF ELECTRODE VOLTAGE PHASE IN A HIGH-ENERGY ION IMPLANTATION MACHINE, AND A MEANS FOR ACCURATE CALIBRATION OF ELECTRODE VOLTAGE PHASE

(75) Inventor: David K. Bernhardt, Hudson, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 297 days.

(21) Appl. No.: 11/334,265

(22) Filed: Jan. 18, 2006

(65) Prior Publication Data

US 2007/0164237 A1 Jul. 19, 2007

(51) Int. Cl.
*H01J 37/317* (2006.01)
*H05H 9/00* (2006.01)
*G21K 5/10* (2006.01)

(52) U.S. Cl. ............... 250/492.21; 250/396 R; 250/492.1; 250/492.2; 250/492.3; 327/156; 327/159; 327/162; 331/1 R; 331/25; 375/344; 375/376

(58) Field of Classification Search ............. 250/492.21
See application file for complete search history.

(56) References Cited

U.S. PATENT DOCUMENTS

| | | | |
|---|---|---|---|
| 4,656,394 A | 4/1987 | Perraudin | |
| 4,659,999 A | 4/1987 | Motoyama et al. | |
| 4,700,108 A | 10/1987 | Morse | |
| 4,713,581 A | 12/1987 | Haimson | |
| 4,992,744 A | 2/1991 | Fujita et al. | |
| 5,128,623 A * | 7/1992 | Gilmore | 327/107 |
| 5,729,028 A * | 3/1998 | Rose | 250/492.21 |
| 5,910,753 A * | 6/1999 | Bogdan | 331/17 |
| 5,936,565 A * | 8/1999 | Bogdan | 341/152 |
| 6,423,976 B1 * | 7/2002 | Glavish et al. | 250/492.21 |
| 6,522,177 B1 * | 2/2003 | Spampinato | 327/107 |
| 6,583,429 B2 * | 6/2003 | Saadatmand et al. | 250/492.21 |
| 6,635,890 B2 * | 10/2003 | Saadatmand et al. | 250/492.21 |
| 6,653,643 B2 * | 11/2003 | Saadatmand et al. | 250/492.21 |
| 6,831,280 B2 * | 12/2004 | Scherer | 250/492.21 |
| 2004/0227106 A1 * | 11/2004 | Halling | 250/492.21 |
| 2005/0045835 A1 * | 3/2005 | DiVergilio et al. | 250/492.21 |
| 2007/0164237 A1 * | 7/2007 | Bernhardt | 250/492.21 |

* cited by examiner

Primary Examiner—Nikita Wells
Assistant Examiner—Bernard Souw
(74) Attorney, Agent, or Firm—Eschweiler & Associates, LLC

(57) ABSTRACT

An improved HE LINAC-based ion implantation system is disclosed utilizing direct digital synthesis (DDS) techniques to obtain precise frequency and phase control and automated electrode voltage phase calibration. The DDS controller may be used on a multi-stage linear accelerator based implanter to digitally synchronize the frequency and phase of the electric fields to each electrode within each stage of the accelerator. The DDS controller includes digital phase synthesis (DPS) circuits for modulating the phase of the electric field to the electrodes, and a master oscillator that uses digital frequency synthesis or DFS to digitally synthesize a master frequency and phase applied to each of the DPS circuits. Also disclosed are methods for automatically phase and amplitude calibrating the RF electrode voltages of the stages.

15 Claims, 17 Drawing Sheets

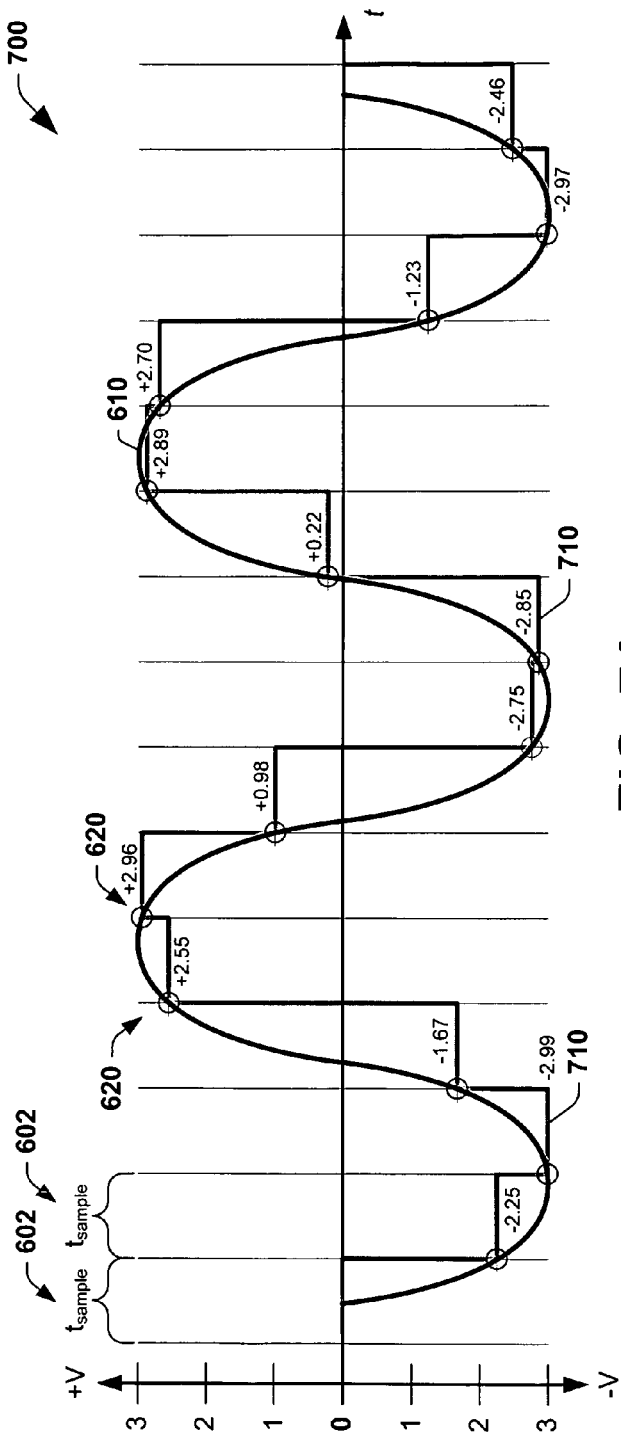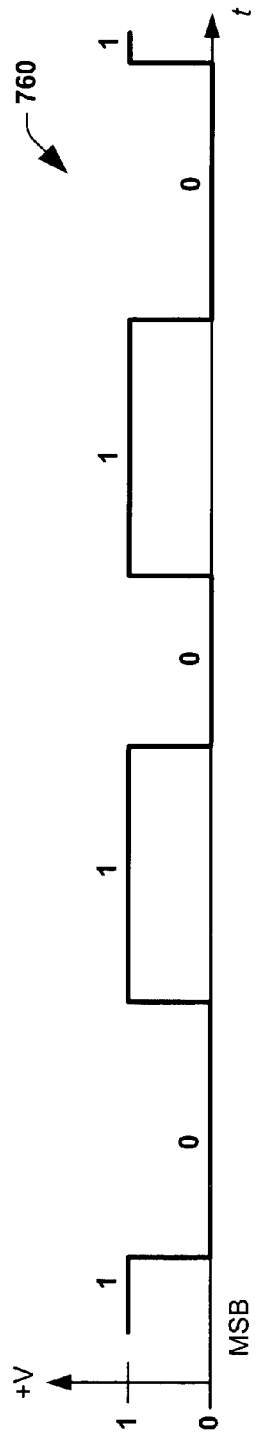
FIG. 7A
FIG. 7B

APPLICATION OF DIGITAL FREQUENCY AND PHASE SYNTHESIS FOR CONTROL OF ELECTRODE VOLTAGE PHASE IN A HIGH-ENERGY ION IMPLANTATION MACHINE, AND A MEANS FOR ACCURATE CALIBRATION OF ELECTRODE VOLTAGE PHASE

FIELD OF THE INVENTION

The present invention relates generally to ion implantation systems, and more specifically to apparatus and methods for improved frequency and phase control and calibration in an ion implantation system utilizing digital frequency and phase synthesis techniques.

BACKGROUND OF THE INVENTION

In the manufacture of semiconductor devices, ion implantation is used to dope semiconductors with impurities. High energy (HE) ion implanters are used for deep implants into a substrate in creating, for example, retrograde wells. Implant energies of 1.5 MeV (million electron volts), are typical for such deep implants. Although lower energy may be used, such implanters typically perform implants at energies between at least 300 keV and 700 keV. Some HE ion implanters are capable of providing ion beams at energy levels up to 5 MeV. A LINAC (LINear ACcelerator) is often used to accelerate the ions to achieve these high energy levels required at the wafer.

A LINAC is a chain of accelerating assemblies (e.g., stages or slices), applied usually in a straight line. When a beam of ions is accelerated by a LINAC, and applied to a semiconductor substrate to implant the ions into the surface of the semiconductor substrate or wafer, we call the process "ion implantation".

Digital frequency synthesis (DFS) and digital phase synthesis (DPS) are techniques for creating continuous waveforms with high precision and high reproducibility. Their use in communication systems dates from the mid-1970s, and today they are an integral component in nearly every modem at any communication speed. The two methods taken as a whole are frequently called DDS (Direct Digital Synthesis). This powerful method of phase synthesis has also been applied to research type linear accelerators, where it replaced less accurate analog control systems or was incorporated into digital-signal processing (DSP) systems that have accreted significant circuit functionality to simplify and reduce the physical size of the implementation of the LINAC control system.

The control of the many electrode phases in a LINAC used as an ion-implantation process tool in a production environment, however, introduces phase-control challenges not common to research accelerators. For example, the specific set of data representing the operating electrode voltage amplitudes and phases for the entire accelerator system (a "dataset") may need to be reproduced on multiple tools in multiple locations, and the dataset may need to be applied and brought to a fully operational state on the tool quickly. It is particularly important that this dataset be quickly reproduced on a production LINAC when multiple ion implantation processes are applied to the same substrates (e.g., wafers) in what is commonly called a "chained" implant process.

In addition, because manual calibration methods are presently used, the ability to transport and implement a dataset among two or more otherwise similar LINAC-based ion-implantation machines is affected by the accuracy with which the non-variant "static" component of the phase errors of the many electrode voltages have been removed from the system during calibration. Such manual phase and amplitude calibrations induce a "human factor" of measurement variations during the calibration process generating machine-specific phase delay errors.

Referring to FIG. 1, a typical high energy ion implanter 10 is illustrated, having a terminal 12, a beamline assembly 14, and an end station 16. The terminal 12 includes an ion source 20 powered by a high voltage power supply 22. The ion source 20 produces an ion beam 24 which is provided to the beamline assembly 14. The ion beam 24 is then directed toward a target wafer 30 in the end station 16. The ion beam 24 is conditioned by the beamline assembly 14 which comprises a mass analysis magnet 26 and a radio frequency (RF) LINAC 28. The mass analysis magnet 26 passes only ions of an appropriate charge-to-mass ratio to the LINAC 28. The LINAC 28 includes a series of resonator modules or acceleration stages 28a-28n, each of which further accelerates or decelerates ions from the energy they achieve from prior stages. The accelerator stages are individually energized by a high RF voltage which is typically generated by a resonance method to keep the required average power reasonable.

The linear accelerator stages 28a-28n in the high energy ion implanter 10 individually include an RF amplifier, a resonator, and an accelerating electrode. The resonators, for example, operate at a frequency of, for example, 13.56 Mhz, with a voltage of about 0 to 150 kV peak-to-peak, in order to accelerate ions of the beam 24 to energies over one million electron volts per charge state. As the ion beam 24 travels through the various accelerator modules or stages 28, some of the ions therein are properly accelerated, whereas others are not. Inefficiencies in ion transport are increased by the errors produced by inaccuracies in the phase calibrations of the electrodes as well as the phase synchronization between the electrodes.

It is necessary to precisely control the frequency and phase of each electrode during implantation of high-energy ions onto a workpiece, such as a semiconductor product. It is important in a production environment, that the dataset representing the electrode voltage amplitudes and phases for an accelerator of an ion implantation system be quickly reproduced and be made fully operational on multiple tools in multiple locations. This is particularly important when the dataset is reproduced on a production LINAC during a "chained" implant process. Accordingly, there is a need in the production environment for an improved HE LINAC-based ion implantation device, utilizing the advantages of direct digital synthesis DDS and a means of automatic phase and amplitude calibrations that avoids the need for error prone manual calibration methods.

SUMMARY OF THE INVENTION

The present invention is directed to a high-energy linear accelerator based ion implanter that achieves improved frequency and phase control as well as improved efficiency, using direct digital synthesis (DDS). The goals of the present invention are further achieved, in part, by using an automated phase calibration system and method disclosed herein. The DDS control system uses digital frequency synthesis or DFS in the master oscillator, while digital phase synthesis or DPS is used to control and synchronize the voltage phase to each RF electrode of the multi-stage accelerator. The DDS control systems and calibration methods of this technique ensure that the ions are efficiently controlled and accelerated to the target wafer. Preferably, the DFS and DPS controls are centralized utilizing a single integrated circuit (chip) implementation.

However, several multi-chip configurations and a few distributed implementations are also illustrated herein, and other such implementations are also anticipated in the context of the present invention. Thus, the invention provides significant advantages over conventional ion implantation device control apparatus and methodologies.

As indicated previously, the control of the many electrode phases in a LINAC used as an ion-implantation process tool in a production environment introduces several phase-control challenges not common to research accelerators. For example, the specific set of data representing the operating electrode voltage amplitudes and phases for the entire accelerator system (a "dataset") may need to be easily reproduced on multiple tools in multiple locations, and the dataset may need to be applied and brought to a fully operational state on these tools quickly. It is particularly important that this dataset be quickly reproduced on a production LINAC when multiple ion implantation processes are applied to the same substrates (e.g., wafers) in what is commonly called a "chained" implant process.

DDS is uniquely capable of providing this inter-tool dataset matching together with fast and accurate electrode-phase dataset changes. The advantages of DDS for use in a production ion-implantation process tool can be better assured by incorporating an automated method of electrode voltage phase and amplitude calibration, to eliminate the "human factor" of measurement variations during the calibration process that minimizes machine-specific phase delay errors.

In one preferred embodiment of the invention, the variable phase-delay elements of the control system for the LINAC in the ion implantation machine are implemented as a DDS controller coupled to an energy source and adapted to digitally synchronize the frequency and phase of the electric fields of each stage in the linear accelerator. The DDS controller comprises a plurality of DPS circuits individually connected to one of the plurality of RF electrodes and used to modulate the phase of the electric field applied to each RF electrode. The DDS controller further comprises a master oscillator (typically a quartz-crystal oscillator) driving a digital frequency synthesis DFS circuit element which generates a continuous stream of n-bit binary values that represent the phase at each instant in time, of the desired LINAC operating frequency. The DFS circuit element is connected to the plurality of DPS circuits and is adapted to digitally synthesize a master frequency and phase to the DPS circuits. Each DPS circuit controls an RF electrode of a stage of the multi-stage accelerator (LINAC).

In another aspect of the invention, the DDS controller further comprises a phase locked loop (PLL) circuit connected between one of the plurality of DPS circuits and a corresponding one of the plurality of RF electrodes.

In yet another aspect, the master oscillator comprises a digital accumulator and a look-up table adapted to digitally synthesize a master frequency and phase for each of the DPS circuits, by reconstructing digitally calculated samples derived from the look-up table, by associating the phase of each sample to a corresponding voltage amplitude. The accumulator may comprise a summation circuit and a digital storage register for accumulating sample values.

In still another implementation aspect, the DPS phase controls are centrally located within a single chip.

In accordance with a further aspect of the invention, the DPS phase control circuits or the output registers of the DPS phase controls are uniformly located at the perimeter of a chip.

In another aspect, the output signals of the DPS phase control circuits are uniformly spaced and separated by a common ground or another such supply terminal at the perimeter of the chip.

In yet another aspect, the DDS controller is configured such that the output signals of the DPS phase control circuits comprise differential outputs from a chip.

In another aspect of the invention, a phase calibration system for an ion implanter comprises a phase detector having an electrode voltage signal input to a first attenuator and a reference phase signal input to a second attenuator. The signals are mixed by a linear phase detector (e.g., implemented as a double balanced mixer (DBM) and terminated into a resistor). The resulting mixed signal is lo-pass filtered to provide a phase error signal representing the phase difference between the electrode voltage signal and the reference signal. The calibration system further comprises a voltage amplitude detector adapted to receive the electrode voltage signal and to provide an electrode voltage amplitude signal used for the voltage calibration of the electrode voltage signal.

In yet another aspect, the phase error signal and the electrode voltage signal are connected to a computer measurement and control system adapted to provide phase calibration and amplitude compensation for the electrode voltage signal.

The phase calibrations may thus be performed autonomously by the phase calibration system and computer measurement and control system to eliminate the more error prone manual calibrations which were previously done. Thus, a HE ion implantation system is more accurately and efficiently controlled using the DDS techniques and calibration methods.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 7A is a graphical illustration of the desired or reference sinusoidal waveform of FIG. 6A, and the measured values of the digital samples;

FIG. 7B is a graphical illustration of the most significant bit or MSB of the measured values of the digital samples of FIG. 7A, during waveform reconstruction using the DFS circuit of FIG. 6B;

DETAILED DESCRIPTION OF THE INVENTION

Figure 1:
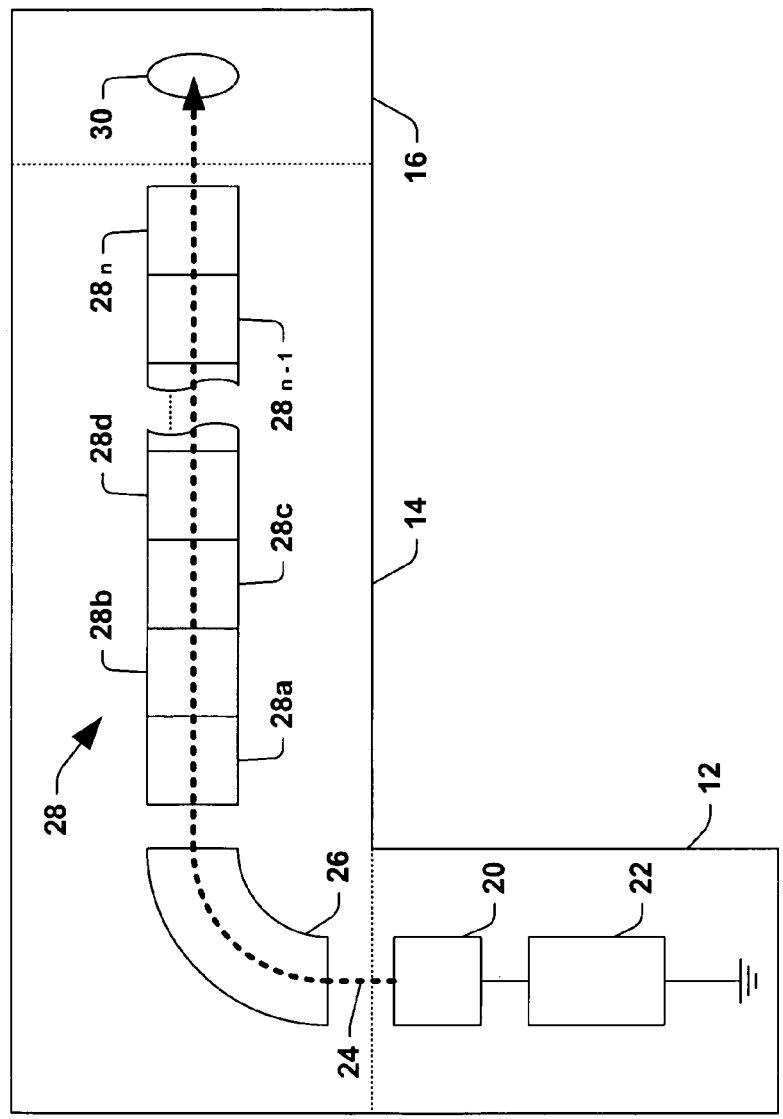
FIG. 1 is a schematic block diagram illustrating a high energy ion implanter having a linear accelerator.

The present invention will now be described with reference to the drawings wherein like reference numerals are used to refer to like elements throughout. A DDS controller is provided for digital frequency and phase control of the RF electrodes in a high-energy multi-stage linear accelerator (LINAC) based ion implantation system. The DDS control system may be employed in the accelerating stages of the linear accelerator to provide precise control of the phase of the voltage applied to the individual electrodes, such that the desired implantation energy is achieved with a minimal loss of ions in the linear accelerator. The DDS controller includes digital frequency synthesis (DFS) and digital phase synthesis (DPS), and may be implemented in a single chip configuration to minimize phase delay errors. The DDS controller may also utilize differential outputs to minimize cross-talk and phase deviations that may result therefrom. The invention further includes automated phase calibration apparatus and methods for further improvement of electrode voltage control and for enabling a data set of calibration values which may be used to achieve operation of the implanter at a predetermined calibration point.

Figure 2:
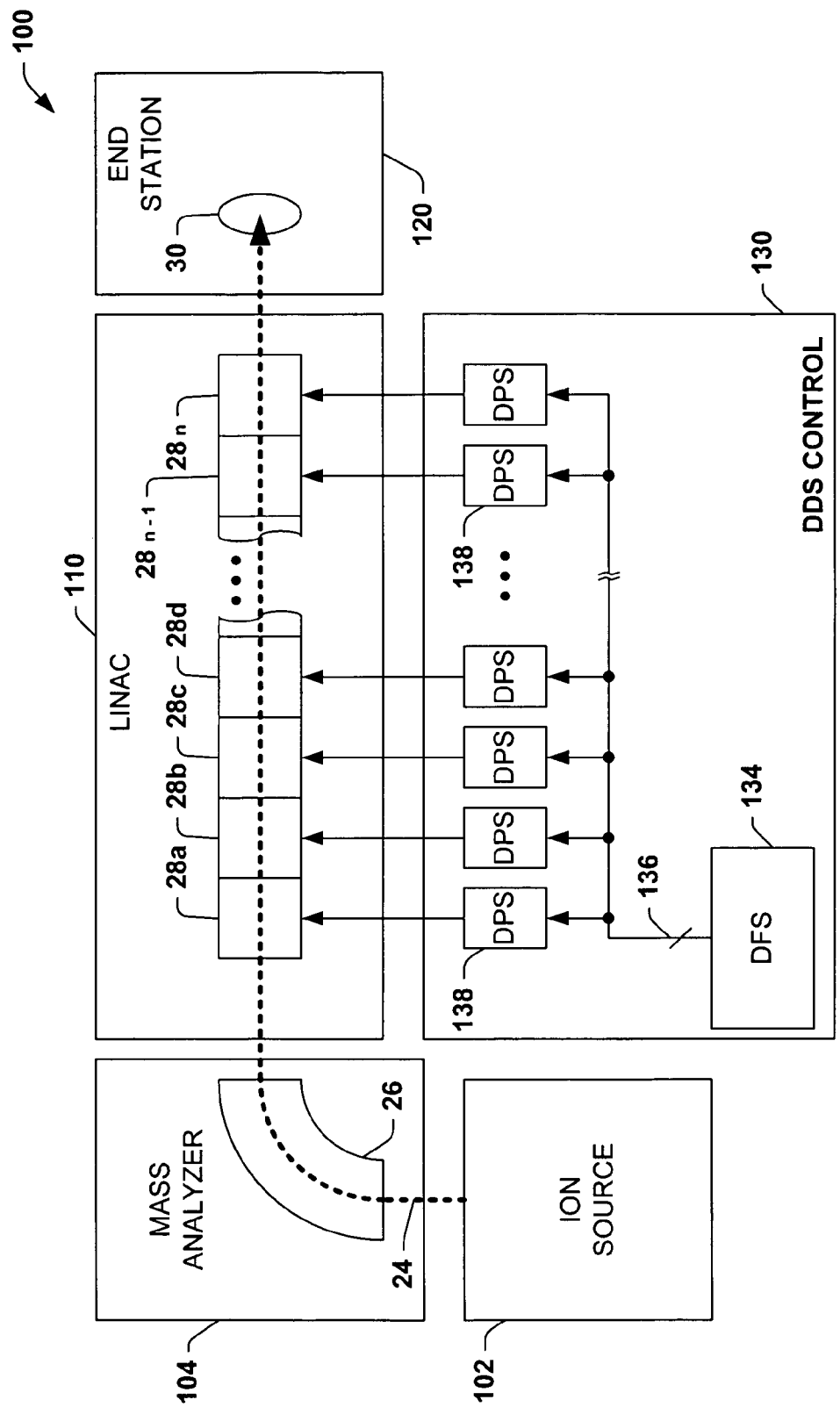
FIG. 2 is a schematic block diagram illustrating an exemplary high energy ion implanter having a linear accelerator and a DDS control system, such as may be used in accordance with the present invention.

The present invention will now be described in the context of an ion implanter and in association with the following drawings. Referring now to FIG. 2, an ion implanter 100 is illustrated, having similarities to the conventional implanter of FIG. 1, and as such need not be completely described again for the sake of brevity. Ion implanter 100 comprises an ion source 102, a mass analyzer 104, a linear accelerator 110, and an end station 120. The ion source 102 produces an ion beam 24 which is conditioned for acceptable mass and energy by the mass analysis magnet 26 of the mass analyzer 104. The mass analysis magnet 26 passes only ions of an appropriate charge-to-mass ratio to the LINAC 110. The ion beam 24 is then accelerated to a desired energy state by the radio frequency (RF) linear accelerator LINAC 110. The ion beam 24 is then directed toward a target workpiece or wafer 30 in the end station 120.

The LINAC 110 includes a series of acceleration stages 28a-28n, which incrementally accelerate ions of the beam 24 to higher energy levels as the ions traverse the length of the LINAC 110. The accelerator stages 28a-28n are individually energized by a high RF voltage which is typically generated by a resonance method.

In accordance with the present invention, a DDS controller 130 controls the stages 28a-28n of the LINAC 110. The DDS controller 130 comprises a master oscillator implemented in a DFS circuit 134 (e.g., a quartz-crystal oscillator) that provides a master frequency signal 136 comprising an N-bit phase word to a plurality of DPS circuits 138 or phase delay elements that individually control the phase of the master frequency signal 136 to an RF electrode within each of the stages 28a-28n.

In particular, the variable phase-delay elements 138 of the control system 130 for the LINAC 110 in the ion implantation machine 100 are implemented as a DDS: that is, a master oscillator signal 136 drives a digital frequency synthesis or DFS circuit element 134 which generates a continuous stream of n-bit binary values that represent the phase at each instant in time, of the desired LINAC operating frequency.

Figure 3:
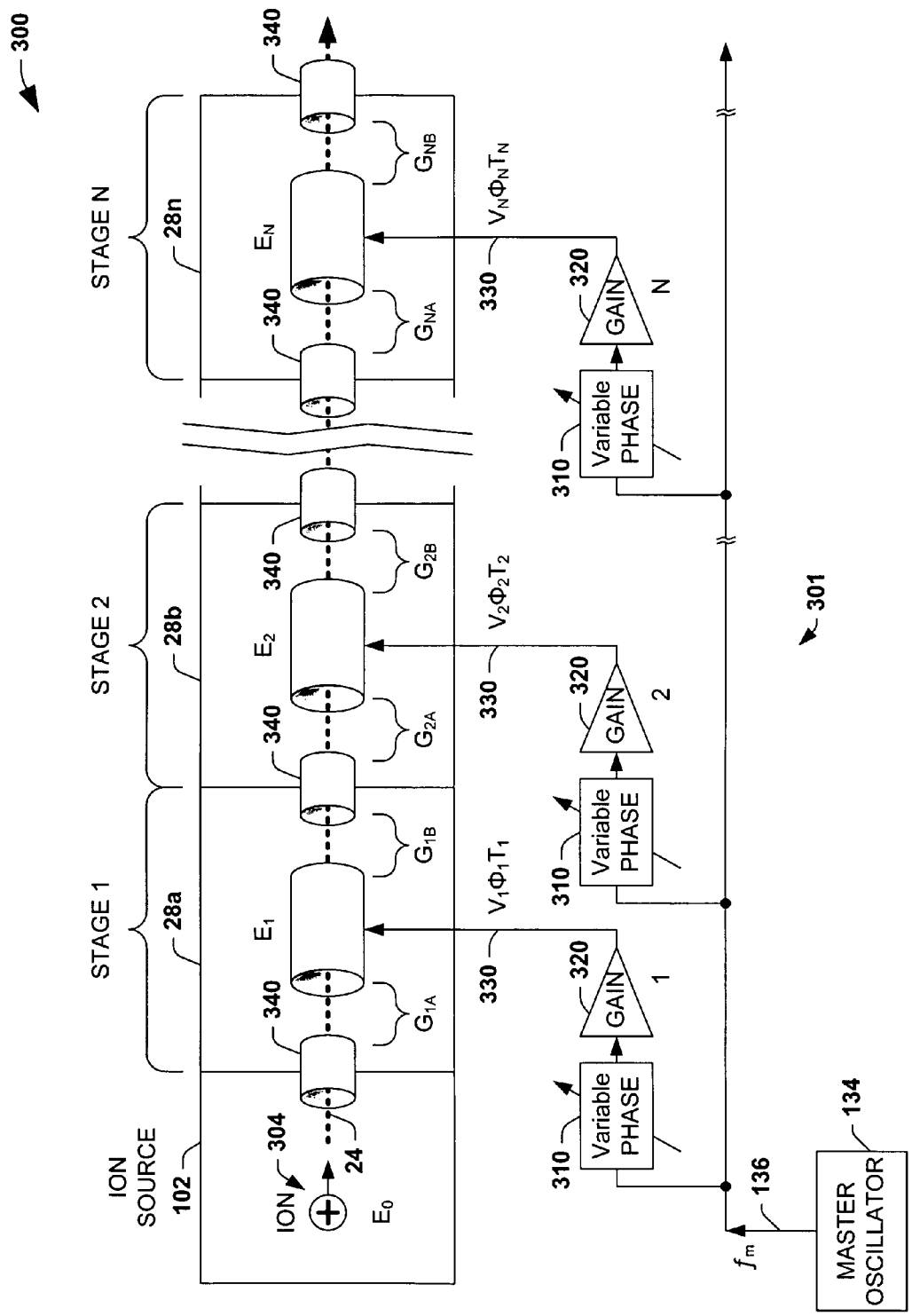
FIG. 3 is a simplified perspective view of several stages of a linear ion accelerator, an ion beam, and associated phase controls which may be employed in an ion implantation system.

FIG. 3 illustrates an "N" stage LINAC 300, through which an ion 304 may be accelerated as part of an ion beam 24. LINAC 300 further includes a LINAC control section 301 comprising an ion source 102 and acceleration stages 28a-28n. Each of the acceleration stages 28a-28n contain RF electrodes $E_1$-$E_N$ which is individually controlled by variable phase control circuit 310, a gain stage (or amplifier) 320 via a high voltage connection 330 to one of the RF electrodes $E_1$-$E_N$.

In the LINAC 300 of FIG. 3, as the ion 304 travels ballistically from left to right, it drifts into the first acceleration gap ($G_{1A}$), where it is accelerated (or decelerated) by the instantaneous voltage of a high voltage RF (Radio Frequency) electrode $E_1$. The ion 304 drifts through the electrode $E_1$, and enters gap $G_{1B}$ where it is again accelerated or decelerated as a result of the instantaneous voltage present across gap $G_{1B}$ before the ion 304 enters the low-field region of the next inter-cavity drift tube 340. The ion 304 continues to propagate through all N stages 28a-28n of acceleration, ending up with a total energy that may be approximated as the original energy of the ion ($E_0$) plus the sum of the instantaneous voltages at each gap $G_{1A}$-$G_{NB}$:

$$E_{FINAL(N)} = E_0 + (i=0-N)\Sigma(E_{GiA} - E_{GiB}) \quad \text{a)}$$

(Wherein, equation "a" above, indicates a summation of the quantity ($E_{GiA}$-$E_{GiB}$) is performed over the range of "i" from 0 to N.)

If it is desired to maximize the energy transferred to the ion 304, it is apparent that it is desirable that $E_{GiA}$ and $E_{GiB}$ (the voltages present at electrode Ei), while the ion 304 is being accelerated in the first gap $G_{iA}$ and second gap $G_{iB}$, should be opposite polarity so that they sum to a greater value. To achieve this, the RF voltage waveform at electrode Ei must be delayed by a time ti that approximates the ballistic transition period of the ion from the center of the previous electrode E(i−1) to electrode Ei. This travel time for the ballistic ion may be re-expressed as a phase delay on electrode Ei relative to electrode E(i−1), where (very approximately):

$$\text{Phase Delay} = \phi_{di}[\text{degrees}] \sim 360[\text{deg/cycle}] \cdot f_M[\text{cycles/sec}] \cdot t[\text{sec}] \quad \text{b)}$$

Thus, a set of electrode voltages VN and phase delays $\phi_N$ can be conceived to achieve a specific total final ion energy for a specific initial ion energy, charge, and mass. In practice, many practical real-world influences cause the RF voltage ($V_i$)'s phase ($\phi_i$) to be other than predicted, as will be shown in FIG. 4.

Figure 4:
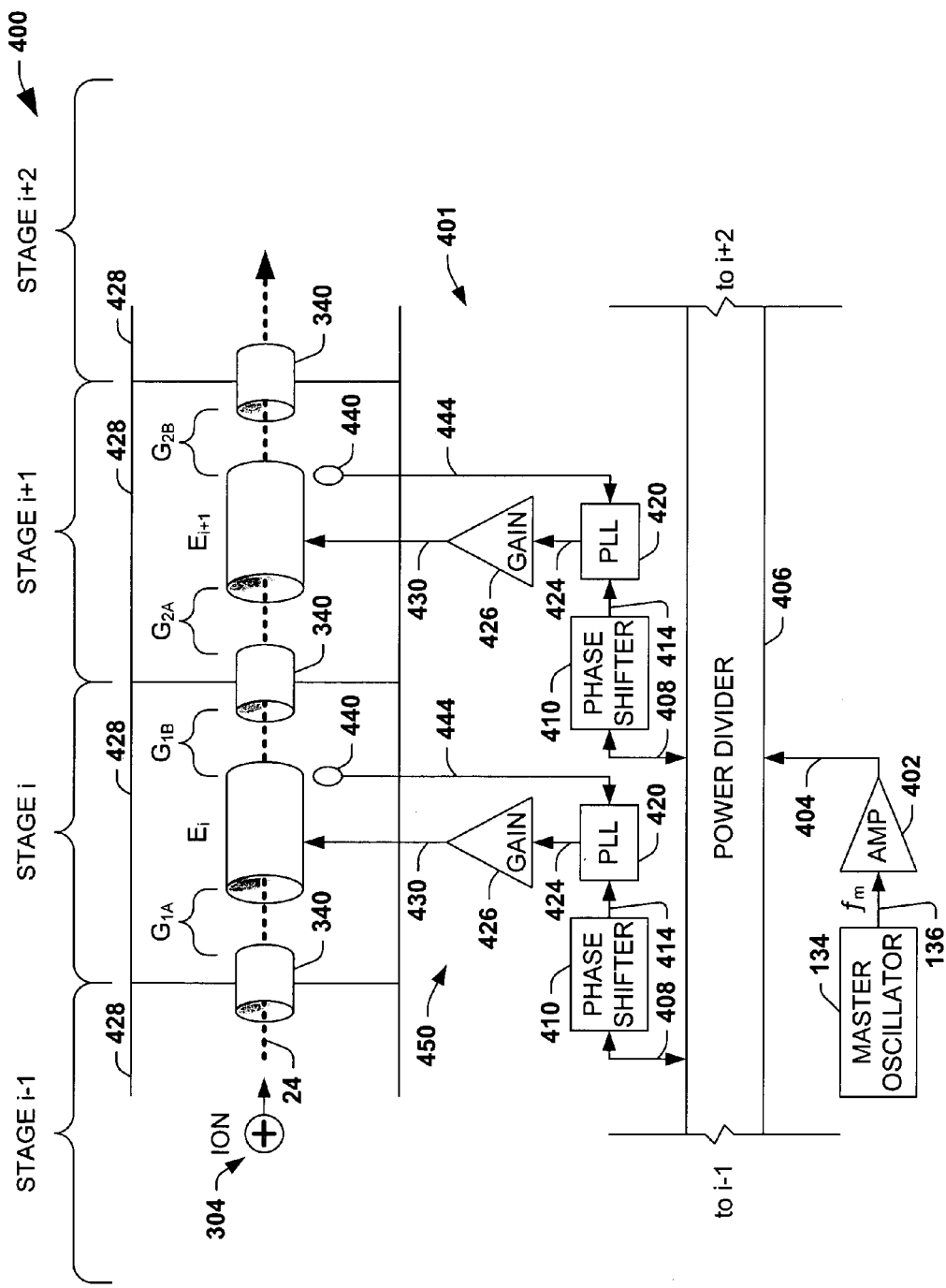
FIG. 4 is another simplified perspective view of several stages of a linear ion accelerator, an ion beam, and associated frequency and phase controls which may be employed in an ion implantation system.

For example, FIG. 4 illustrates another "N" stage LINAC 400, through which an ion 304 may be accelerated as part of an ion beam 24. LINAC 400 is similar to that of implanter 300 of FIG. 3, and as such need not be completely described again for the sake of brevity. LINAC 400 further includes a control section 401 comprising an amplifier 402 for amplifying the master frequency signal $f_M$ 136 to a higher power level master frequency signal $f_M$ 404 (e.g., about 25 mW) applied to a power divider 406, for example, a transformer with multiple secondary outputs of 406 extending from stage i−1 to stage i+2 or to stage i=n. In this example, each stage comprises a power divider output cable 408 which feeds a copy of the master frequency signal $f_M$ 136 to a phase shifter 410 and a phase lock loop PLL 420 via PLL output cable 424 to gain stage 426 that may comprise an amplifier and a resonator, for example, to drive the RF electrodes E1-En of acceleration stages i−1 to i=n 428 via high voltage HV connection 430. A pick-up electrode 440 receives a sample of the voltage $E_i$ which is returned to PLL 420 via pick-up feedback cable 444 to close the phase control feedback loop. Thus phase shifter 410 provides a phase output signal 414 having the selected phase which is maintained by PLL 420 and the other elements of the feedback circuit.

FIG. 4 further illustrates a list of candidate delays between electrodes $E_i$ and $E_{(i+1)}$. Two stages of the overall LINAC 400 are illustrated, although 6-12 stages, for example, may actually be utilized. Operationally, in this embodiment, the RF power amplifiers or "gain" stage 426 is inside a phase locked control loop or PLL 420 so that the variations in phases in the forward path (from the PLL 420, PLL output cable 424, amplifier/gain stage 426, and HV cable 430 to the electrode Ei) are largely eliminated from consideration, leaving the following residual inter-electrode errors:

406a) At the Power divider 406, there are static (fixed) circuit related phase offsets in the power divider circuit 406, or other such methods of reproducing multiple outputs of the master oscillator signal for use by the N stages 428 of the LINAC 400.

406b) At the Power divider 406, there are also drift" terms in these circuits, for example, but not limited to, thermal variations in signal delay, differences in behavior of circuits due to power supply voltage variations causing changes to signal delays.

408) Variation in the length of cable 408 include variations over the range of temperature of the signal phase due to possible impedance mismatching of the cable impedance $Z_O$ to the input impedance $Z_{IN}$ of phase shifter 410.

410) Static and variable phase delays in the phase shifter 410 include non-linearities of phase control wherein the phase shift may have errors from the precise desired value of the phase due to circuit and component variations and inaccuracies in the control signal, for example.

414) As in 408 and 410 above, static and variable phase offsets in the uncompensated forward signal path or the phase output signal cables 414 from the phase shifter 410 output to the PLL 420 input.

420) Variation in the PLL loop behavior of the PLL subsystem 450 manifest themselves as phase offsets (which for modeling purposes are all lumped together herein), including variations in the PLL feedback path 444, and are referred back to the PLL 420 input as lumped static and variable phase offsets.

Consider the realities of constructing and wiring the cables within a LINAC ion implanter. There are multiple cables associated with each stage and consider that one model of implanter, for example, the Axcelis GSD/VHE, uses 14 stages. Thus, many delays are associated with cables in this example. In addition, the Axcelis GSD/VHE implanter utilizes a master oscillator with a 13.56 MHz, which is so chosen because this is a frequency reserved by international treaty for industrial use. The delay in a cable is (assuming that the electrical signal in the cable propagates at 66% of the speed of light):

$$1 \text{ Degree phase delay} = 1.6 \text{ inches of cable length} = 0.2 \text{ nanoseconds} \quad \text{c)}$$

Thus, it is easily seen that manufacturing all of the cables associated with the exemplary 14 stages to exacting lengths can be a costly endeavor. Therefore, Axcellis currently employs a different means of controlling the static (non-variant) phase delays by manually calibrating the phase of each electrode.

In this manual calibration method, phase offset values are methodically and repeatedly changed, using known test cables and an oscilloscope, until a precise trigger point and an associated phase offset is achieved, wherein each electrode is calibrated to within 1 degree of phase. This phase offset value is communicated to the control electronics associated with each new electrode until the exact same calibration point is achieved, resulting in a table of values of phase offset, having one value for each electrode of the LINAC.

Thereafter, control software in the control system of ion implanter uses these calibration phase offsets to adjust the command value of phase at each electrode. This process automatically negates the repetitive static phase shift associated with the multitude of static offsets present within each electrode's control sub-system, as though they were physically manifested as a single lumped value for each electrode.

To enable phase control, each electrode generally requires a variable phase element. This element must be capable of setting any arbitrary predetermined phase delay within an initial precision and operational stability suitable for the LINAC's overall operational specifications. For research type accelerators, long term stability and initial repeatability requirements may be very low for several reasons.

For example, the uniqueness of a laboratory LINAC may make phase setup tables among similar machines unnecessary. The overall length of time that a LINAC is operated for a single experiment may be small. In addition, the setup time to initially establish operation of a new phase setup table may not be important; the operational scenarios for the LINAC may be limited, requiring little variation in phase setup tables from one experiment to the next. For example, the LINAC used as an injector to a proton storage ring may only be used to accelerate protons (H+) into the ring at a fixed energy (e.g., 103 MeV).

Contrast these research LINAC phase stability requirements with those of a LINAC used to accelerate ions in a commercial ion implanter application for implanting dopant species into semiconductor wafers.

For example, many production machines must behave similarly and predictably, to allow sharing of phase setup tables, hereinafter "recipes", among machines in the facility, throughout the company, and among cooperating companies such as partners and foundries. In addition, a single ion implant may require several hours to achieve a particular customer-specified density of implanted ions or "dose", and the LINAC must be stable to within the customer's energy accuracy requirements. If the final ion energy drifts out of specification undetected, it may impair the functionality of the semiconductor devices being doped. If it is detected during processing, the process may be suspended while the LINAC phase controls are readjusted back into specification. Then, the process may be resumed, resulting in a loss of production time that may require rescheduling other process tasks at considerable expense.

Further, each new batch of wafers to be implanted may require a unique recipe, involving variations such as total dose, rate of dose, final ion energy, and ion species (e.g., boron, arsenic, phosphorus). Even within and during processing of a single process, the process may be composed of several sub-processes each with it's own unique recipe. These multiple linked implants are commonly called "chained implants". As each recipe is loaded and the LINAC is adjusted to achieve the operational specifications called for by the recipe, time delays occur during these many setup events causing loss of availability of the tool and thus lost productivity. Accordingly, the inventor appreciates that the more predictable and repeatable a recipe startup process can be made; the lower will be the operational cost.

Thus, it is apparent that fast, efficient, predictable and stable phase control of the LINAC is a critical requirement of a LINAC applied to ion implantation of semiconductors, unique from the usual realm of non-semiconductor environments. Therefore, a discussion of the merits of various phase control methodologies is appropriate in the context of the present invention, to better understand the unique advantages and disadvantages that each method demonstrates.

Time Delay Elements

One family of circuit topologies for introducing variable phase delay (e.g., 310 of FIG. 3, and 410 of FIG. 4) is known as a variable delay line. This class of methods causes the RF waveform from the master oscillator to be delayed in time, without any inherent knowledge of the phase relationships between the input and output of the time delay device. Recall from our example that at 13.56 MHz, 1° of delay=about 1.6 inches of cable length and about 0.2 nanoseconds of time.

Thus, a relay-controlled box of various cable lengths can be constructed to allow a combination of various segments to achieve a desired overall total delay through the assembly. Alternately, an electronic circuit can be devised in an analog continuously variable manner, or as a discrete fixed-step size method to cause the propagation of the master oscillators RF waveform to be delayed by a variable amount. It is critical that this circuit delay be stable and predictable, and yet must achieve a phase delay resolution suitable for the process requirements of a production ion implantation system of about +/−1° resolution minimum. To date, such a time delay circuit has been too expensive, or too variable (e.g., change of delay with temperature) for use in a production ion implantation system.

Phase Delay Elements

Some electronics circuit phase delay methods are truly phase shifting circuits. Through the interaction of inductances and capacitances with variable attenuating elements, leading and lagging phase signals can be summed to produce a phase delay over the entire 0 to 360° range.

Figure 5:
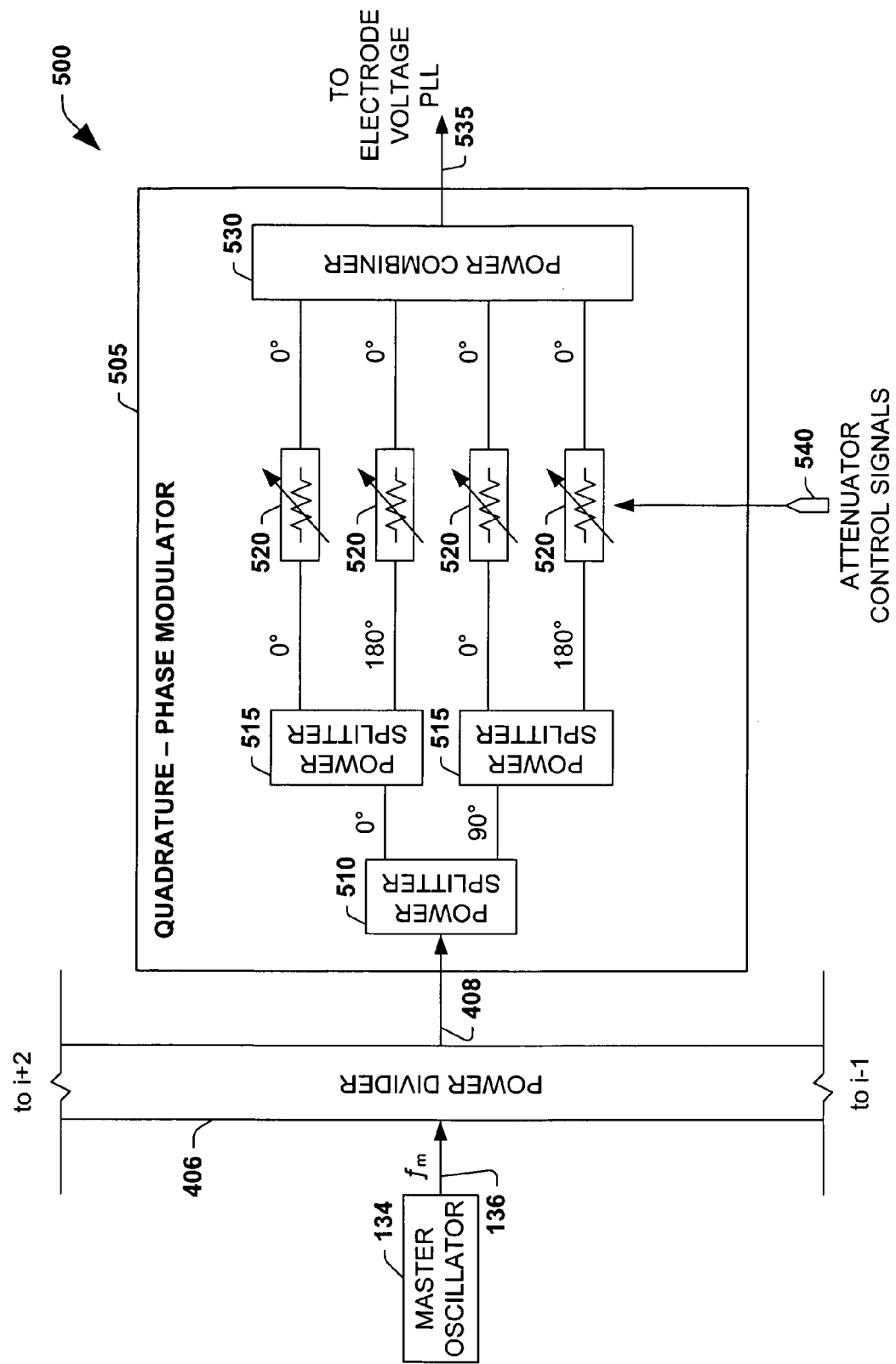
FIG. 5 is a schematic diagram of quadrature phase modulator such as may be used to control the phase to the electrodes of an accelerator.

FIG. 5 illustrates a quadrature phase modulator 500, which is the most straightforward type of phase shifting circuit, having been used in LINAC control systems for many years. It was such a quadrature phase modulator that was employed in a published paper for control of a research LINAC at about 100 MHz, that was used by Hilton Glavish as a template for the initial prototype control electronics on Eaton's first LINAC beamline, as implemented by Donald Berrian in 1985.

Today, a much improved variation of those circuits, which still employ an off-the-shelf commercially available quadrature phase modulator, is utilized to control the phase of the LINAC electrodes in every high-energy ion implantation machine that Axcelis manufactures.

Conceptually, and in some instances in actual physical circuit implementations, the master frequency input signal $f_M$ 408 from master oscillator 134 is split into 2 paths, through the use of a "hybrid" splitter 510 to produce an unshifted (0°) and a shifted (90°) signal, then each signal is again split into 2 paths through 0° and 180° splitters 515 (equivalent to a linear 1:2 turns ratio transformer with a grounded center tapped secondary), producing a signal stream with ¼ of the input signal, each, at 0°, 180°, 90°, and 270°. These four signals go through independently controllable linear attenuators 520, and the attenuated signals are recombined in power combiner 530 to provide the final phase modulated output 535.

For example, if the attenuator 520 in the 0° path is adjusted to provide minimum or no attenuation, and the other attenuators 520 are all adjusted for maximum or complete attenuation, then 0° signal is all that makes it to the output 535. Likewise, each of the other paths can be individually enabled with the other paths disabled, producing solely 90°, 180°, or 270° outputs.

Alternately, when the 0° path attenuation is 0.707 (sine of 45°), and the 90° path attenuation is 0.707 (cosine of 45°), with the 180° and 270° paths disabled, these signals will combine to produce an output whose phase is shifted 45 degrees. Likewise, by controlling the several attenuators with signals in a sin($\phi$) and cos($\phi$) relationship, any phase shift from 0 to 360° can be produced. However, there are also several error terms that result from this circuit.

1) With only the 0° path enabled, there will be some finite phase shift observed at the output. The baseline or static component of this shift can be eliminated from the forward path phase shift as part of the electrode phase calibration process, that was discussed earlier herein. However, variations with time, temperature, and signal and circuit power supply fluctuations are not eliminated during calibration and will result in phase delay errors when a recipe is initially loaded.

2) The 90° and 180° paths may not be precisely 90° or 180°, due to variations in component values, stray signals coupling between closely spaced components and variation in parasitic stray capacitance and inductance in each circuit path.

3) Variation in performance of each attenuator 520, including the absolute and relative gain, and linearity of the attenuators 520, affect how predictably a particular desired phase angle will be achieved. Using the best available technology today, the phase accuracy is best at the "ordinal points", (e.g., 0°, 90°, 180°, and 270°) where only a single attenuator dominates the performance. In addition, the error is greatest at the 45° points mid-way between the ordinal points, where two attenuators equally share the signal path. A typical device today achieves a typical overall phase drift for a set point, due to time temperature and power supply variations, of approximately +/−1°, but an initial phase setting error of +/−1.5° (1 sigma/"RMS", or 1 Std deviation) and +/−4° worst case. However, +/−4° is our established present error threshold level.

From the preceding discussion, it may be seen that whenever a recipe is transferred from one LINAC based ion implantation machine to another "identical" machine, then, each electrode phase may have a recipe initialization phase error of about +/−1.73 degrees RMS (=SQRT(2×1.5°)) and +/−8 degrees worst case=(+4°−(−4°)). These initial phase setup inaccuracies are sufficiently large that it may require a specialized "recipe tuning" software method for several minutes to bring the final energy of the ion beam to within the operational parameters required by the recipe for the particular semiconductor doping operation to be performed. Variations of FIG. 5 may be implemented, but such variations achieve the same effect and largely exhibit the same shortcomings and disadvantages.

Once a recipe has been re-tuned from one machine to operate acceptably on a second machine, then the revised recipe on the second machine can be stored, and recalled so that the time required to subsequently re-initialize the recipe on the second machine is very quick, because the phase setting errors associated with the quadrature phase modulators are usually very repeatable and reproducible.

Digital Frequency Synthesis and Digital Phase Synthesis, or Direct Digital Synthesis (DDS)

This frequency and phase control technique has become know as DDS. In DFS (Digital Frequency Synthesis), any repetitive waveform may be "synthesized" by reconstructing it from digitally calculated samples, when those samples are chained together at a sampling rate greater than twice the frequency of the desired output. Then, on average (e.g., after filtering, etc.), the output waveform will be reconstructed. The higher the ratio of waveform sampling rate to the desired output frequency, the more accurate will the reconstructed signal be. Generally, sinusoidal waveforms are of the greatest interest in LINAC devices.

Figure 6A:
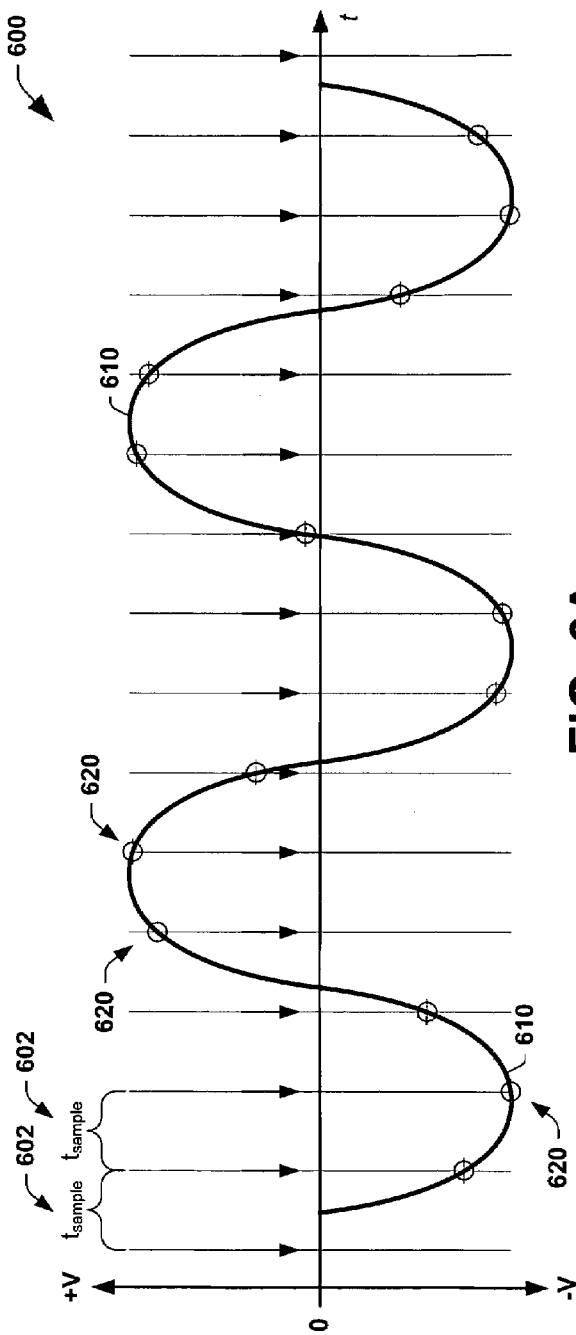
FIG. 6A is a graphical illustration of a desired or reference sinusoidal waveform used as the basis of the ion beam acceleration and which is to be reconstructed from digital samples at "N" times the frequency of the reference waveform.
Figure 6B:
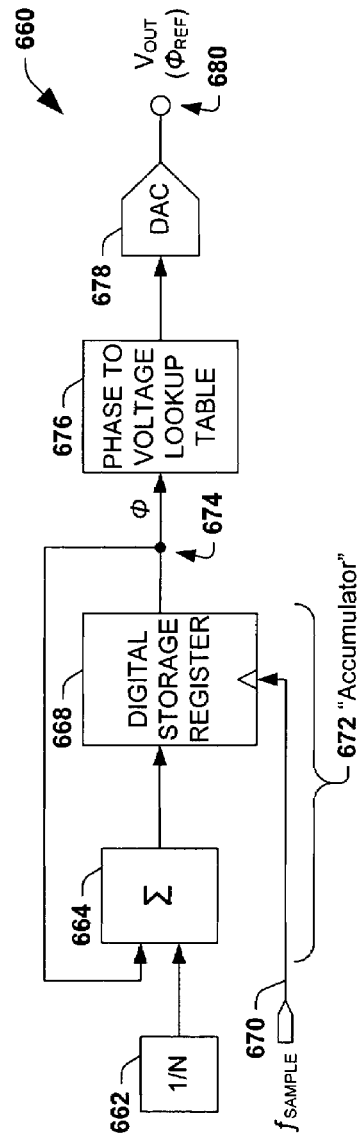
FIG. 6B is a schematic diagram of a basic digital frequency synthesis or DFS circuit which may be used to reconstruct the sinusoidal waveform of FIG. 6A.

For example, FIGS. 6A and 6B illustrate the sampling 600 of a sinusoidal waveform 610 and a DFS circuit 660 for reconstructing the sampled waveform 610. The DFS circuit block 660 comprises a sample source oscillator input 670, a numeric constant (frequency devisor) input 662 to a summation block 664, and a digital storage register 668 that produces a digital phase output word 674. Collectively, the summation block 664, the digital storage register 668, and the feedback path form a digital "accumulator" 672. The DFS circuit 660 also comprises a phase to voltage look-up table 676 and a digital to analog converter (DAC) 678 operable to provide a voltage output 680, which is a digitally sampled representation of the sinusoidal waveform 610. Sinusoidal waveform 610 is sampled at "N" times it's base frequency, which may be shown as:

$$f_{OUT} = f_{SAMPLES} * (1/N) \qquad \text{d)}$$

The time period between the samples is $t_{sample}$ 602, and the sample value is the instantaneous phase angle 620. Each time a digital storage register 668 is "clocked" by $f_{SAMPLE}$ clock input 670 at rate:

$$f_{SAMPLE} = N(f_{OUTPUT}), \qquad \text{e)}$$

The register takes on the new sample value I of:

$$\text{Value}_{(i)} = \text{Value}_{(i)} + (1/N) \qquad \text{f)}$$

Note: Value is fractional part only [0 . . . <1] carry to 1 or greater is disregarded and the overflow is ignored.

This data word "value" is the phase of the output signal waveform, $V_{(t)}$ at time $t_i$. By using a look-up table 676, or another such computational means, the output voltage Vout 680 or $V_{(t=ti)}$ will correspond to the phase data word 674.

FIG. 7A further illustrates the instantaneous appearance of the digital output waveform 710 as reconstructed by the DFS circuit 660 of FIG. 6B, which when filtered, and on average resembles the original sinusoidal waveform 610 of FIG. 6A. FIG. 7B illustrates only the most significant bit MSB 760 portion of output 710. It can be observed that the MSB 760 represents those samples 620 which are obtained when the sinusoid 610 goes above zero volts (e.g., +, producing a 1 state output) and when the sinusoid goes below zero volts (e.g., −, producing a 0 state output). Thus, the higher the ratio (N) of sampling rate relative to the output frequency, the greater is the immediate fidelity, or instantaneous accuracy of the reconstruction.

A second consideration is the accuracy of the values used in the calculations. Obviously, if the summation, storage register 668 and look-up table 676 are accomplished to an accuracy of about 1 decimal digit (about 3 bits of binary), the samples will be less accurately reconstructed than if the math is done at a higher resolution of about 9 decimal digits (about 30 bits of binary). Therefore, if our goal is to reconstruct a 13.56 MHz frequency from a sampling clock of 231.0 MHz, with an accuracy of better than 0.2 Hz on average, we require:

231,000,000 samples/13,560,000 waveform, and 0.2 Hz resolution/13,560,000 output Hz.  g)

Thus, we need to accomplish our math with an accuracy of:

(Word size)=13,560,000/0.2=67,800,000~67,108,864=2^26=26 bits. (h)

It is commonplace in digital electronic design to construct circuits using building blocks of 8 bits (or a byte), so a 26 bit circuit would typically be implemented using 4 byte wide circuit elements (32 bits resolution). At 13.56 MHz, this results in a frequency resolution of 0.003 Hz.

Digital Phase Synthesis

DPS (Digital Phase Synthesis) may build upon our frequency synthesis method above, to add additional phase-shifted outputs. The output 674 of the accumulator 672 of FIG. 6B provides a number equal to the phase output value (0.000-0.999 . . . ) represents the phase angle (0.0-359.99 . . . degrees).

Figure 8:
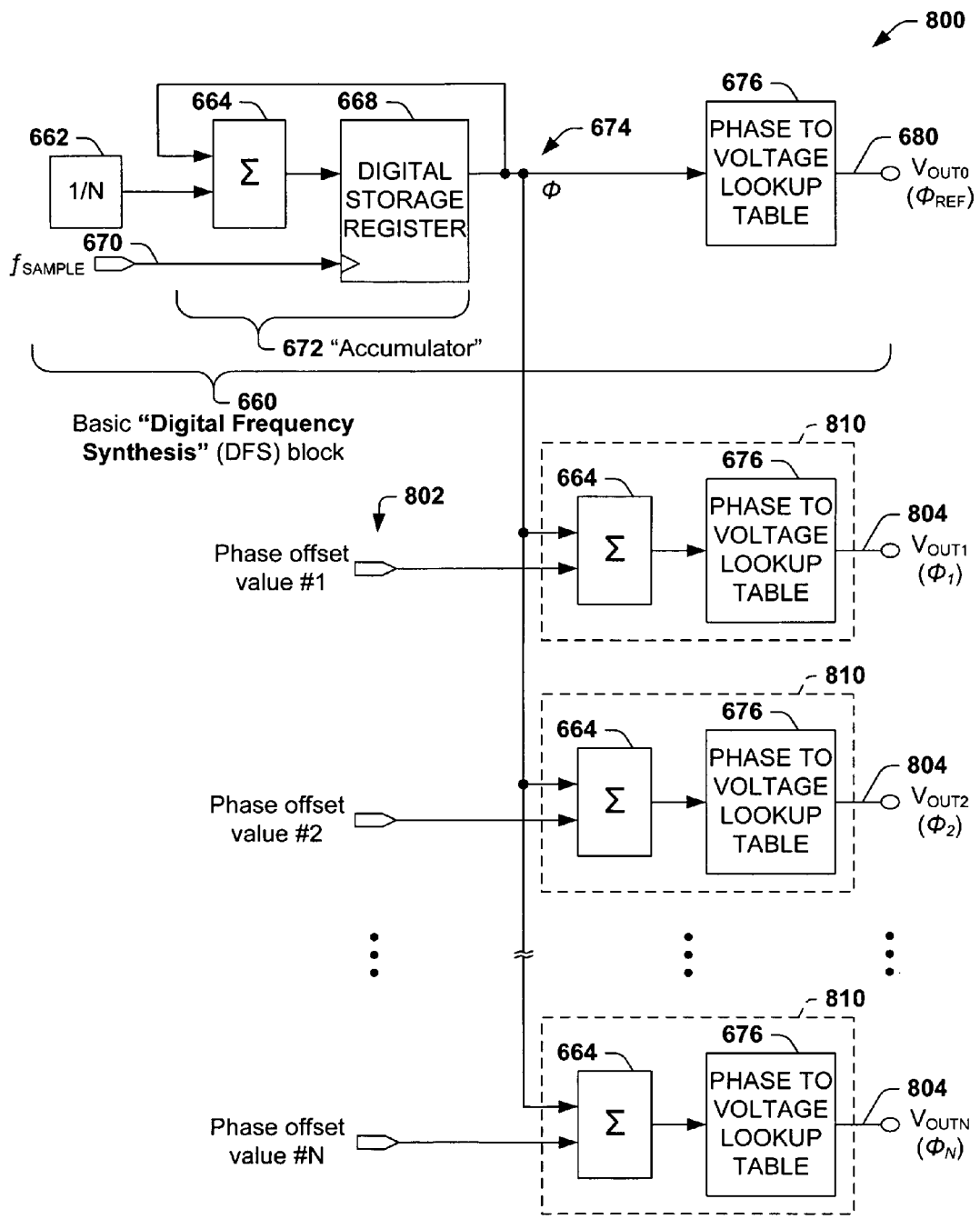
FIG. 8 is a schematic illustration of an exemplary DFS circuit for producing multiple phase shifted outputs according to the invention.

Thus, as shown in FIG. 8, a phase control system 800 may be formed, which introduces a phase shifted output 804 by adding an arbitrary phase offset value 802. Phase control system 800 comprises a basic DFS block 660 and a plurality of phase offset registers 810. Each phase offset register 810 comprises a summation element 664 and a phase to voltage look-up table 676, each register 810 operable to receive one of a plurality of phase offset values 802 (offset value 1, 2 . . . N), to provide one of a plurality of phase shifted outputs $\phi_{REF}$ 680; and $\phi_1, \ldots \phi_2, \phi_N$ 804. As $\phi_{REF}$ has no phase shift, it is used as a reference phase signal.

FIG. 8 comprises one implementation of a phase control system 800 required for a LINAC. Comparing FIG. 3 to that of FIG. 8 illustrates the following contrast of elements. The LINAC control system 301 of FIG. 3 utilizes a master oscillator, while the phase control system 800 of FIG. 8 utilizes a digital frequency synthesis block DFS 660. In addition, the LINAC control system 301 of FIG. 3 utilizes a variable phase block 310, while the phase control system 800 of FIG. 8 utilizes a phase offset register 810.

Although the DFS block 660, as it applies to the master oscillator, is illustrated and described in the context of digital frequency synthesis, it is appreciated that the basic digital frequency synthesis block 660 may be also used with any of the aforementioned methods of phase control for each electrodes phase control. However, it is also possible, in the context of the present invention to utilize digital phase control by partitioning it into either a centralized function together with the DFS, or separately as a stand-alone DDS block (e.g., DFS with DPS).

Figure 9:
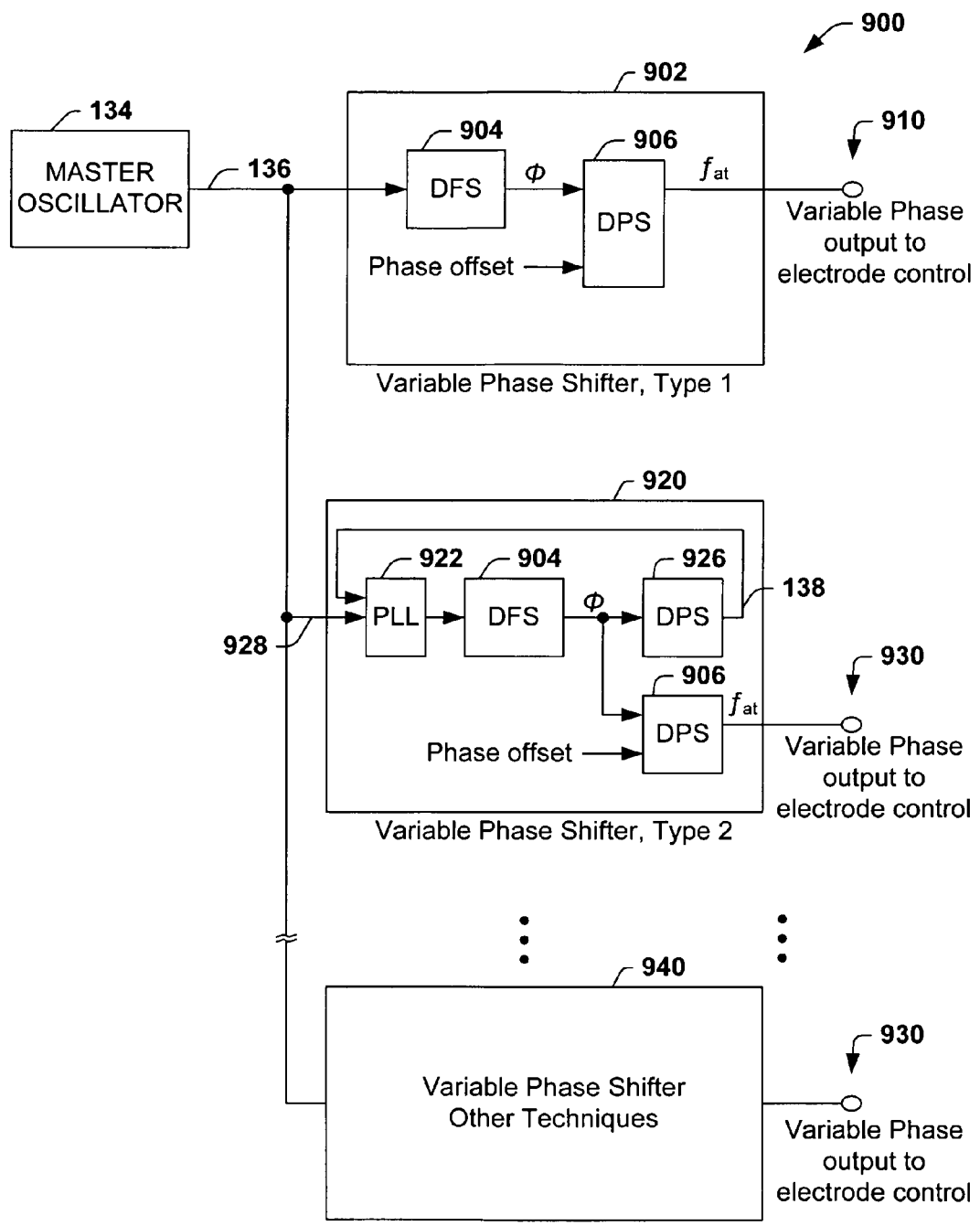
FIG. 9 is a schematic illustration of an exemplary distributed DDS circuit for producing multiple phase shifted outputs utilizing a master oscillator and several variable phase shifting techniques according to the invention.

For example, FIG. 9 illustrates a distributed DDS controller 900 comprising a master oscillator or DFS block 134 driving several phase shifters 902, 920, and 940 constructed in different topologies. The first embodiment (type 1) of distributed DFS/DFS includes a variable phase shifter 902 utilizing a DFS block 904 and DPS blocks 906 and 926 to provide the variable phase output 910 to the electrode controls.

Phase shifter 902 of FIG. 9 illustrates that it is necessary to incorporate a DFS block in order to develop a digital phase word to which an offset may then be applied. As the master oscillator 134 is the only input, one approach would be to use $$f_{SAMPLE} = N(f_{OUTPUT})$$

as the master signal, so that $f_{OUTPUT}$ is locally derived at each point of use (at each phase shifter 902, 920, 940). However, consider a system with many "N" identical blocks of circuit type 1, distributed throughout a LINAC. While each circuit is independently capable of shifting the output to any phase, there is nothing to establish the relative phase output between one distributed type 1 block 902 and the next, as there is no synchronization among the many phase control elements 902.

One solution is to perform the phase calibration discussed earlier. However, as soon as power is removed and then restored to any element of the distributed phase control system 900, the calibration of that element is lost and it must be recalibrated, as the digital circuits may not retain any memory of their relationship to the other elements.

Another approach is to distribute a second signal along with the master oscillator signal that is used to synchronize the many elements. This signal may even be incorporated into the master oscillator signal as a unique voltage event that would be recognized by the distributed phase shifting elements and utilized to initialize each local element to a "startup phase". Following the initialization of all phase shifting elements to this "startup phase", a system phase calibration could be performed. Thereafter, each time it was necessary to resynchronize the many distributed phase shifting elements, the master oscillator would cause the synchronization signal to be sent to all elements, and then a stored copy of the previous phase calibration could be restored to the distributed phase shifting elements to restore all elements to the same synchronous phase output.

A second distributed phase shifting implementation is illustrated in FIG. 9 as variable phase shifter type 2, 920. In this second embodiment, a phase locked loop PLL 922 synchronizes the output 930 of the DFS element 904 to the master oscillator signal 136, so that a known fixed and predictable phase relationship is provided between the DFS block 904 output $\phi$, and the master oscillator input 928 to the distributed phase shifting element 920. Then, the phase offset DPS blocks 906 and 926 can create a phase shifted replica of the DFS block 904 output $\phi$. As previously discussed, calibration can be accomplished and restored reliably and repeatably, without the need to distribute any additional synchronization signals.

Figure 10:
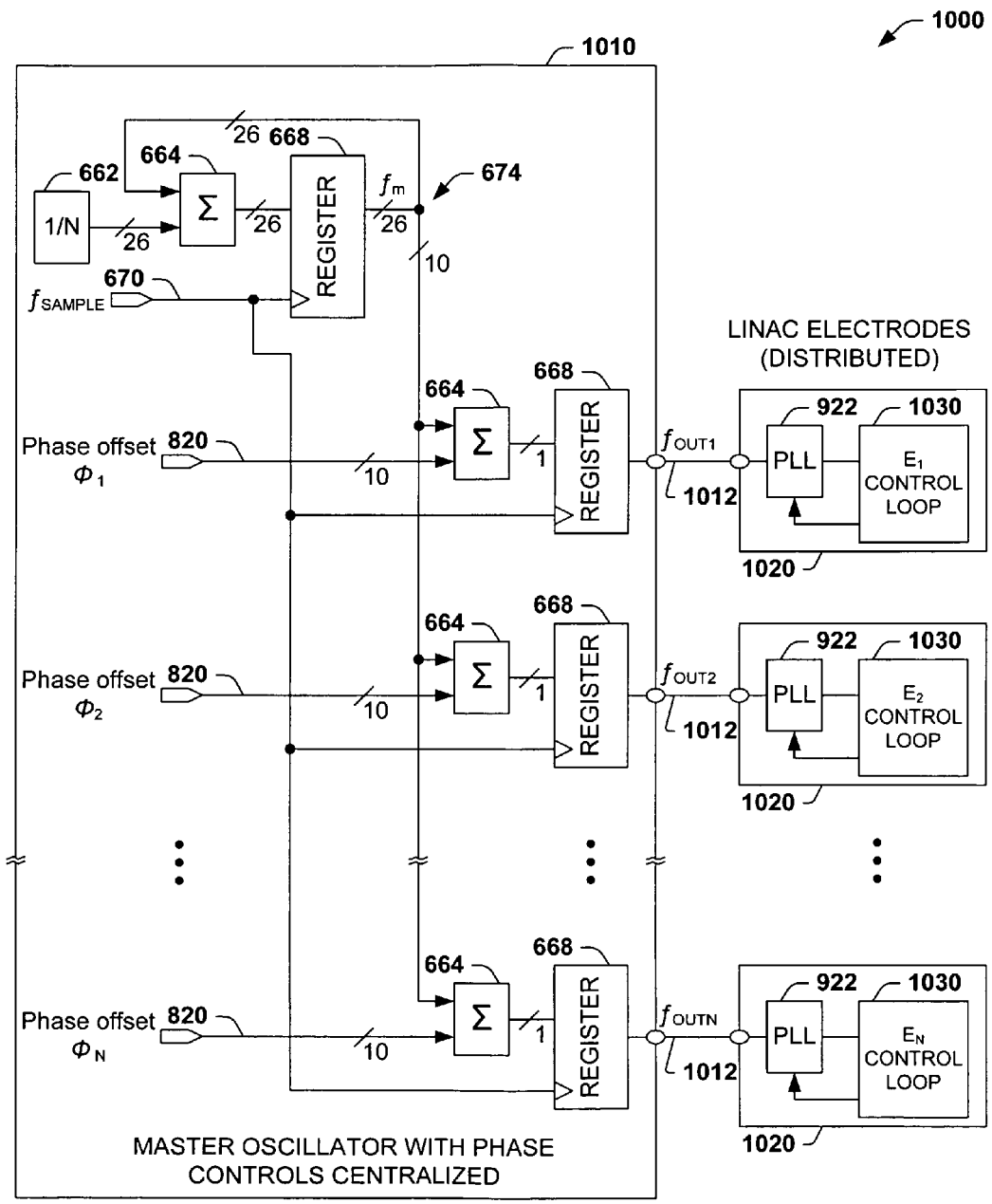
FIG. 10 is a schematic illustration of an exemplary centralized DPS circuit for producing multiple phase shifted outputs and corresponding distributed LINAC electrode control circuits according to the invention.

FIG. 10 illustrates an exemplary centralized DPS circuit 1000 for producing multiple phase shifted outputs and the corresponding distributed LINAC electrode control circuits in accordance with the present invention. The centralized DPS circuit 1000 is also useful for identifying sources of phase errors that cannot be eliminated by a single system phase calibration.

In the foregoing discussion of digital phase synthesis, it should also be noted, that there are accuracy requirements within the phase offset circuit block. For example, in the LINAC controls, it has been determined that the phase shift needs to be adjustable to a relative resolution of at least three degrees (+/−3°), though better resolution would be beneficial. Changes can be observed in ion beam behavior with relative phase adjustments as small as 1 degree, and so it may be hypothesized that an optimal system would have a control resolution of about ½ degree. This is a resolution of 1:720, and requires ten (10) bits of binary circuitry in the phase offset adder circuit (e.g., 664 of FIG. 10). Again, where digital circuits are commonly specified, utilizing 8-bit byte-wide circuit elements, this would typically be implemented as a 16-bit adder circuit.

In addition, the phase look-up table 676 of FIGS. 6B and 8, or its computational equivalent, for example, is not necessary for implementation of phase control of a LINAC. While the summation of the phase offset must be completed to a high accuracy, the most significant bit (MSB) of the summation output may adequately represent the phase of the signal. Recall that the phase control circuit of each distributed electrode phase control element must incorporate a phase locked loop PLL (e.g., 420 of FIG. 4, or 922 of FIG. 10) to eliminate phase error or to reduce the error to below operational requirements. If these distributed PLLs have linear phase detectors that can tolerate fast instantaneous phase errors yet lock to an accurate average phase, and then the $f_{SAMPLED}$ stream of the MSB from the phase offset summation is a viable and adequate signal representing the phase of the desired signal (e.g., sinusoid 610 of FIGS. 6A and 7A).

Waveform 710 of FIG. 7A, for example, illustrates the reconstructed waveform of the sinusoid 610, while waveform 760 is a Boolean train of 1's and 0's representing only the MSB of the $f_{OUT}$ calculation. On average, waveform 760 has the desired exact frequency and phase. Provided that the overall system response only responds to the average waveform, then, the MSB is all that is necessary.

Advantages and Disadvantages of Various DFS and DPS Embodiments in DDS

Figure 11:
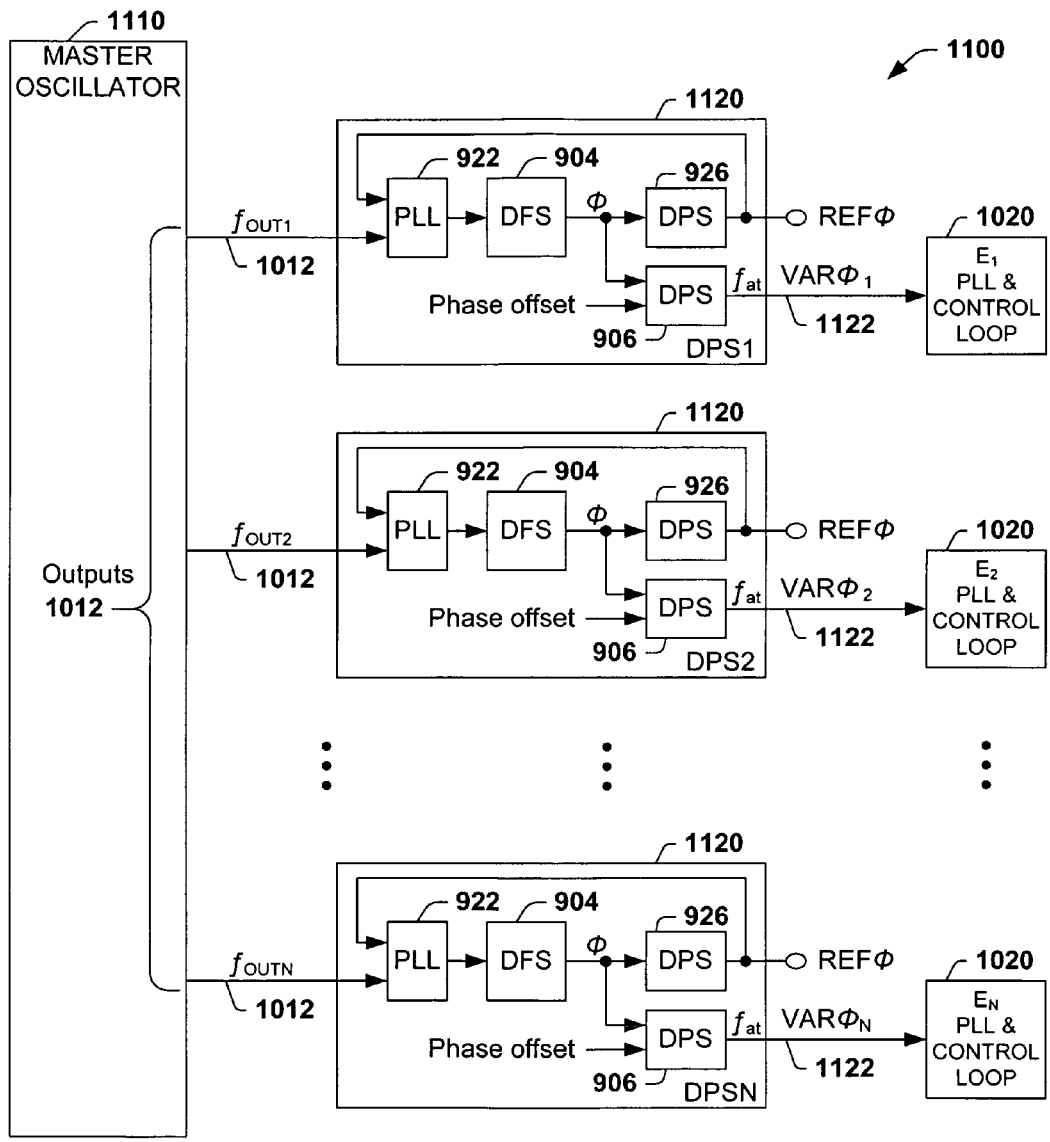
FIG. 11 is a schematic illustration of an exemplary distributed DPS circuit for producing multiple phase shifted outputs and their corresponding distributed LINAC electrode control circuits in accordance with another aspect of the invention.
Figure 12:
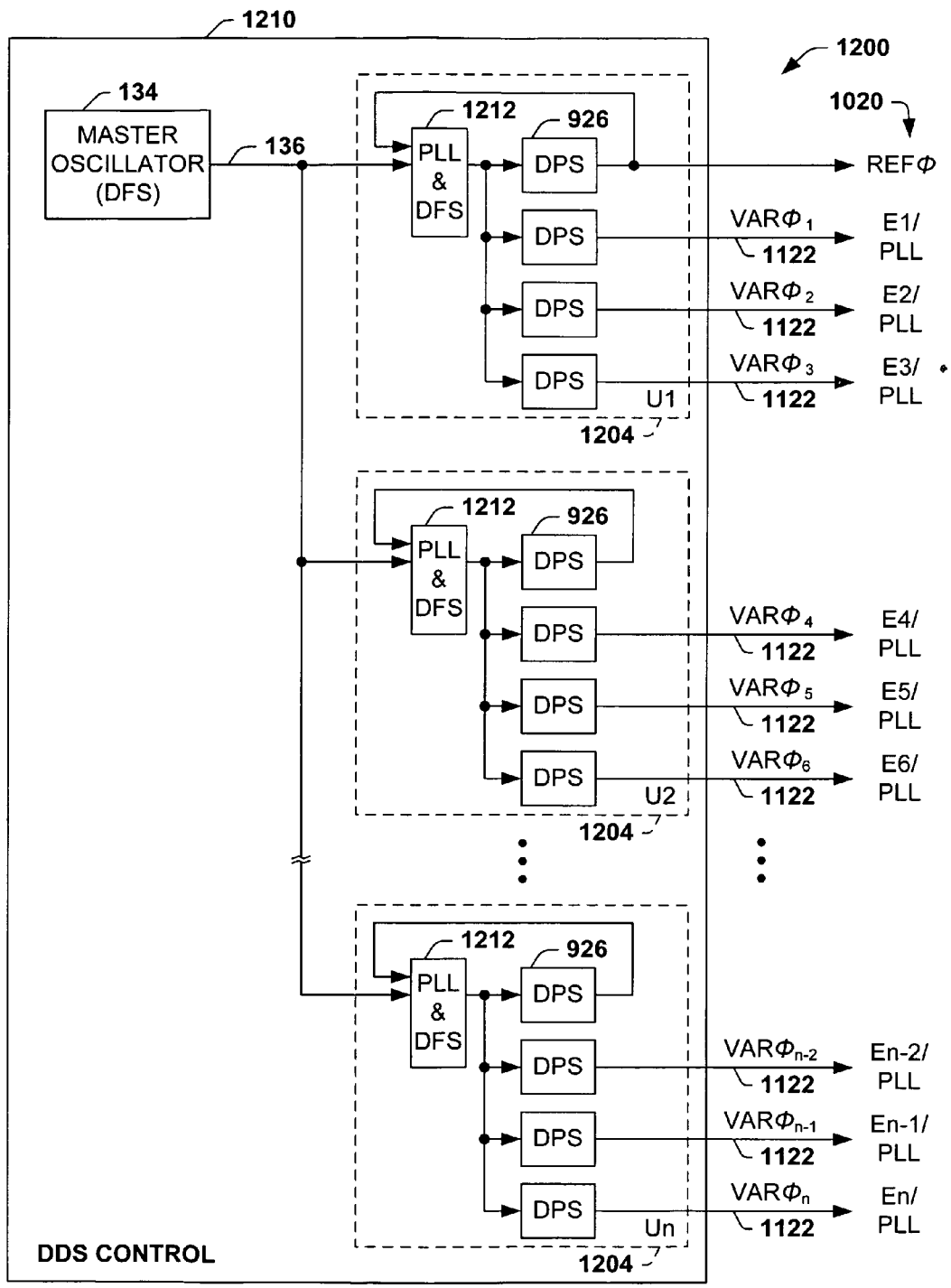
FIG. 12 is a schematic illustration of an exemplary centralized DFS and DPS circuit implemented in a multi-chip DDS control configuration in accordance with an aspect of the present invention.
Figure 13:
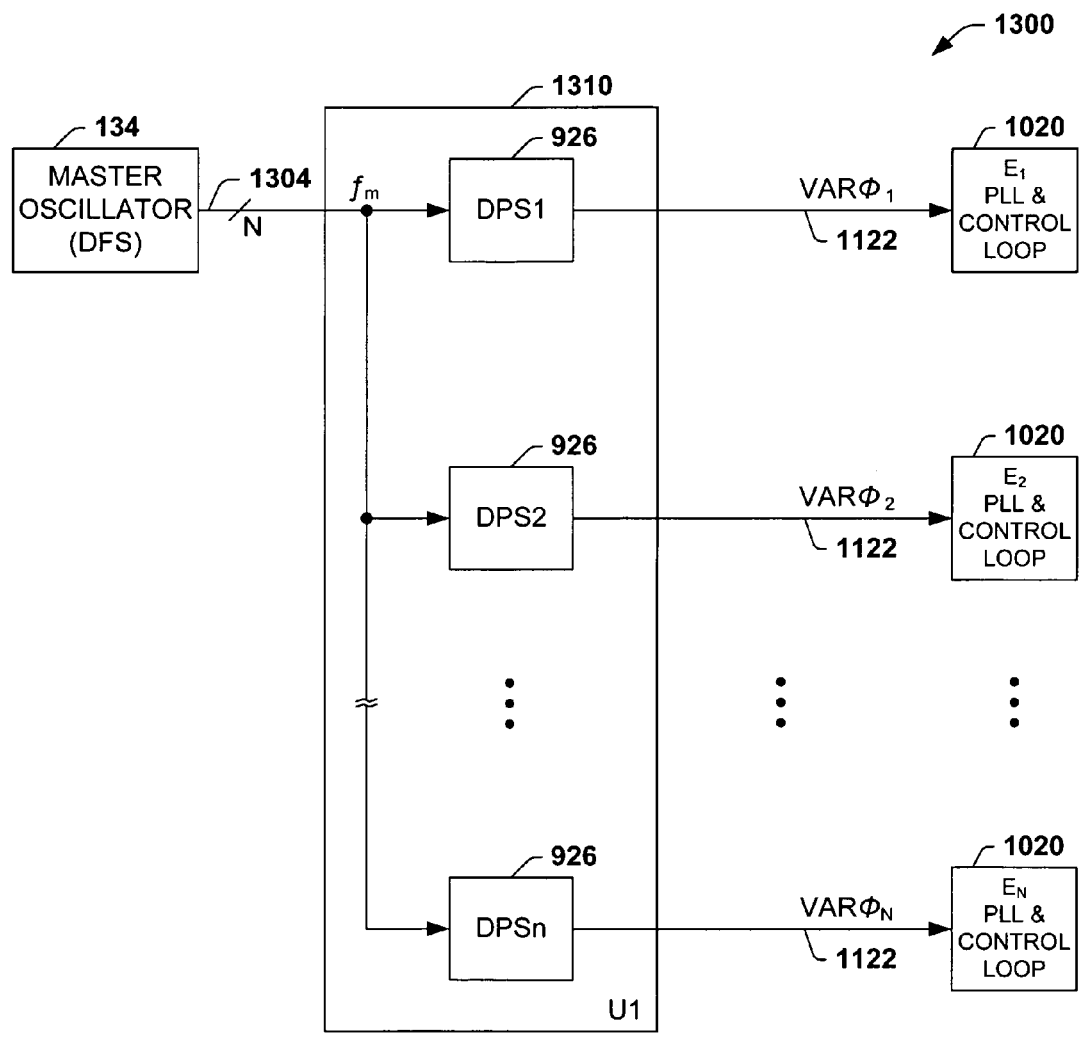
FIG. 13 is a schematic illustration of an exemplary DDS controller implemented in a centralized single-chip DPS circuit configuration in accordance with another aspect of the present invention.

FIGS. 11, 12, and 13 illustrate several possible system partitioning options for implementing digital phase synthesis in accordance with the present invention. To better understand the problems and issues present in DDS control, the following includes a discussion of some of the sources of phase delay errors and recommendations for preferred embodiments for use of digital phase synthesis in LINAC based ion implantation equipment.

The three methods of partitioning and distributing embodied in the LINAC phase delay control circuits of FIGS. 11, 12, and 13, all utilize digital phase synthesis DPS. In addition, all three embodiments have three similar elements;

1) The master oscillator (e.g., 1110, or 134)
2) The variable phase delay DPS (e.g., 926)
3) The electrode PLL (e.g., 1020)

FIG. 11, for example, illustrates an exemplary distributed DPS circuit 1100 for producing multiple phase shifted outputs (e.g., $VAR\phi_1, VAR\phi_2, \ldots VAR\phi_N$) 1122 and their corresponding distributed LINAC electrode control circuits (e.g., $E_1, E_2, \ldots E_N$) 1020 in accordance with an aspect of the invention. The variable phase shifter circuits (DPS1-DPSN) 1120 are distributed within circuit 1100, and are similar to those of FIG. 9 and as such need not be completely described again.

FIG. 12 illustrates an exemplary centralized DFS and DPS circuit 1200 implemented in a multi-chip (e.g., U1, U2 ... Un) 1204 configuration within a DDS control 1210 in accordance with another aspect of the present invention. Again, the variable phase shifter circuits 1204 function similar to those of FIGS. 9 and 11, except that the PLL and DFS circuits are simplified into a combined PLL & DFS circuit 1212 within each of the multiple chips U1-Un 1204.

FIG. 13 illustrates an exemplary DDS controller 1300 implemented in a centralized single-chip DPS circuit (U1) 1310 configuration in accordance with still another aspect of the present invention.

The phase accuracy of the electrode phase locked loop control 1020 is identical and common to all three embodiments indicated above, and will therefore be ignored in the following discussion.

The embodiments of FIGS. 11, 12, and 13 share a similar variation in the phase delay differences between otherwise identical master phase distribution elements (e.g., $f_{OUT1}, f_{OUT2}, f_{OUTN}$) 1012, or phase shifted outputs (e.g., $VAR\phi_1, VAR\phi_2, \ldots VAR\phi_N$) 1122 in the illustrations. In FIG. 11, for example, there is a real phase delay variation between the multiple outputs 1012 of the master oscillator circuit 1110 implementation. In FIG. 12, these delays are transferred to and manifest themselves as variation between the outputs within each functional circuit block (illustrated as though each functional circuit block might be implemented as a single monolithic integrated circuit or chip) (e.g., U1, U2 ... Un) 1204.

Likewise, in the DDS embodiment of FIG. 13, there are still real phase delay variations between the several outputs (e.g., $VAR\phi_1, VAR\phi_2, \ldots VAR\phi_N$) 1122 of this single chip embodiment. Note, however, that a third class of phase errors is unique to FIGS. 11 and 12 and not present in FIG. 13. This error is the additional phase error introduced by the additional PLL 922 that is required to resynchronize the DPS circuit block (1120 of FIG. 11, or 1204 of FIG. 12) to the master oscillator (e.g., 1110, or 134), in both the distributed DPS 1100 of FIG. 11 and the multi-chip DPS implementation 1200 of FIG. 12.

Another way of understanding this last error source is to consider FIG. 12, modified, wherein the first PLL/DPS block (U1) 1204 would have all "N" outputs (e.g., $VAR\phi_1, VAR\phi_2, \ldots VAR\phi_N$) 1122, rather than only three outputs within chip (U1) 1204. Thus, as a single chip solution, the inter-chip delay variation, and this source of phase error may be eliminated, as illustrated in the example of FIG. 13.

Figure 14A:
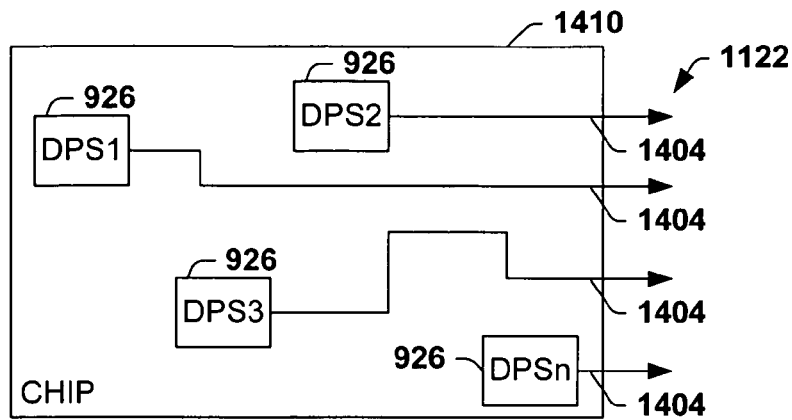
FIG. 14A is schematic illustration of an exemplary DDS controller implemented in a single chip configuration, wherein phase delay variations may arise due to wiring path length variations when the plurality of DPS output circuits are non-uniformly located.
Figure 14B:
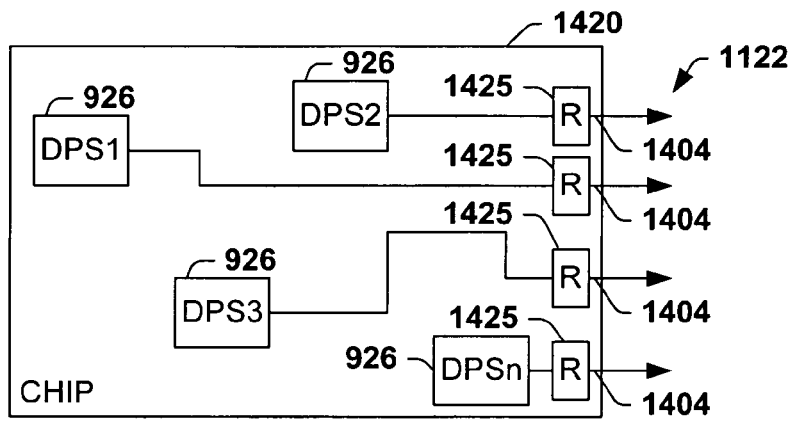
FIG. 14B is a schematic illustration of an exemplary DDS controller implemented in a single chip configuration, wherein the plurality of DPS circuits may be non-uniformly located about the chip, but the output registers of the DPS circuits are uniformly located and are simultaneously re-clocked to avoid phase delay variations.
Figure 14C:
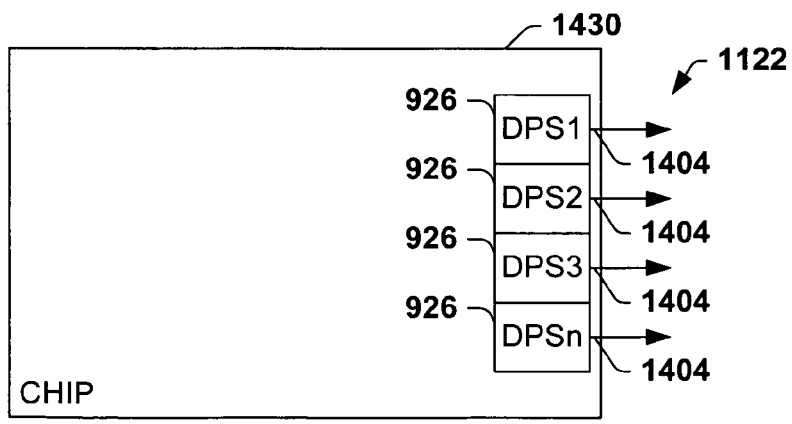
FIG. 14C is a schematic illustration of an exemplary DDS controller implemented in a single chip configuration, wherein the plurality of DPS circuits are uniformly located at the perimeter of the chip having uniform signal path lengths to avoid phase delay variations.

FIGS. 14A, 14B and 14C illustrate the sources of phase error within a single chip embodiment, for example, chip (U1) 1310 of FIG. 13. In practice, there are multiple circuit or chip implementation characteristics that combine to manifest themselves as phase errors between topological and circuit considerations whose embodiments will controllably affect this total inter-circuit phase error.

The first controllable element of inter-circuit phase error is the propagation delay between the output 1122 of each DPS element 926 and the leads 1404 of the device 1410. On the left, this is shown graphically, where DPS1 (926) clearly has a long circuit path compared to that of DPSN 926, which has a very short circuit path. DPS2 and DPS3 have other non-negligible path delays. While, in practice, the "static" or "initial" magnitude of these inter-circuit phase delays can be eliminated during the calibration process discussed earlier, the variation in delay in each path, due to temperature, voltages, or other time-variant processes, will not be eliminated.

FIGS. 14B and 14C illustrated circuit implementation solutions which will minimize the variation of the inter-circuit delay error. In both of these examples, the goal is to make the initial physical signal propagation delay between the many DPS blocks and the device leads 1404, identical. When these delays are the same, in a single chip implementation, then the physical mechanisms that cause time-variant delay errors will manifest themselves uniformly among the many circuits. The result is that the variations in delays are very similar and therefore cancel each other out, leaving essentially no net inter-circuit phase delay error.

The solution of FIG. 14C accomplishes this minimization of the inter-circuit phase delay errors by co-locating all of the DPS elements 926 uniformly within chip 1430 with respect to the device's output signal leads 1404. However, for a chip implementation with many outputs, this may not be practicable due to physical constraints imposed by the chips internal implementation or configuration.

Therefore, another more generalized embodiment is show in FIG. 14B, wherein the individual and many DPS elements 926 may be non-uniformly distributed within the chip 1420, but wherein their signals are each re-clocked through output registers 1425. The output registers 1425 are themselves uniformly distributed with respect to the output leads 1404 of the device 1420. Because the register-to-device lead propagation delays within the chip are uniform and similar, they will eliminate any inter-channel phase delay variations.

Figure 15A:
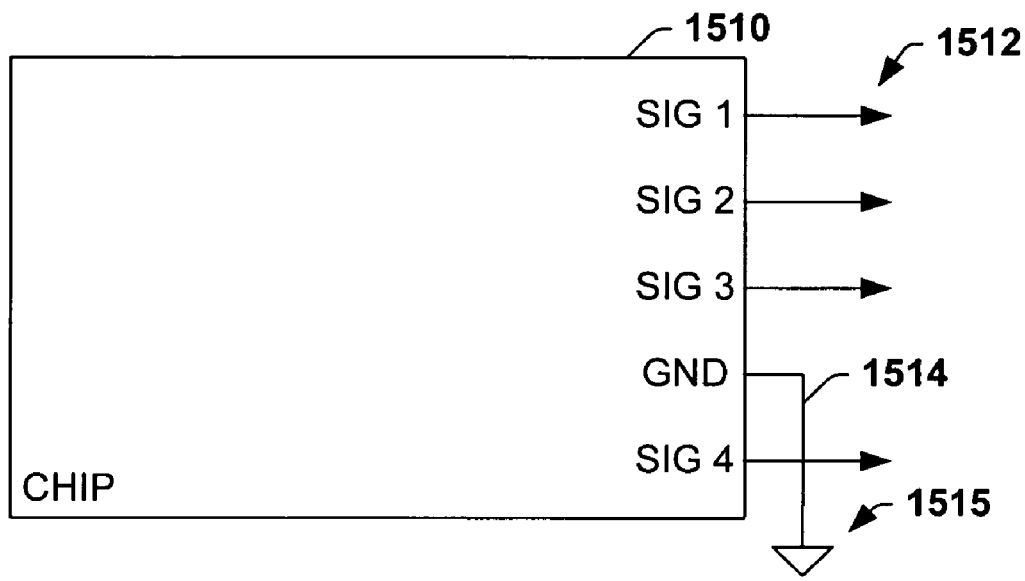
FIG. 15A is a schematic illustration of an exemplary single-chip DDS controller configuration, wherein a non-uniform ground or supply pin distribution may cause delay differences among the implemented device output paths.
Figure 15B:
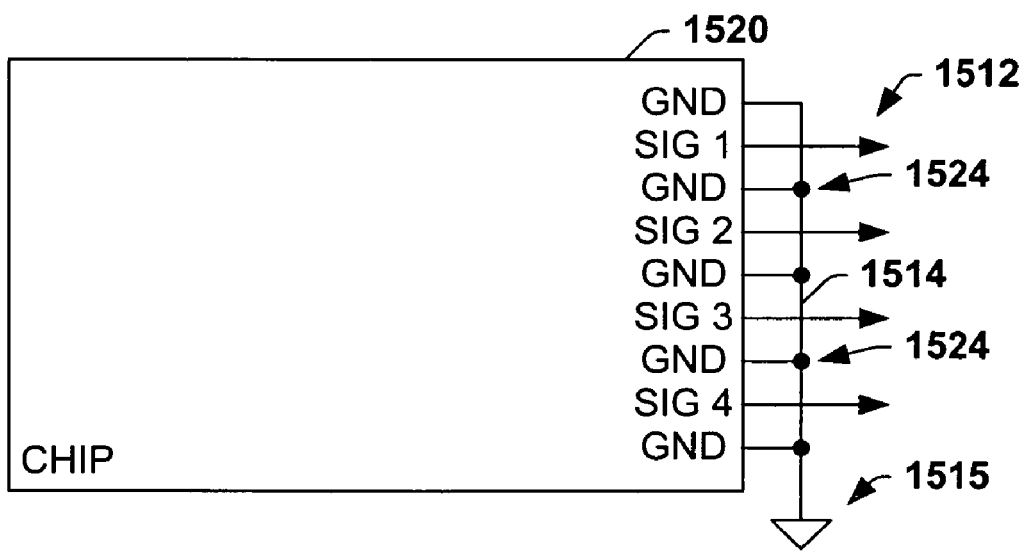
FIG. 15B is a schematic illustration of an exemplary single-chip DDS controller configuration, wherein a uniform ground or supply pin distribution minimizes the delay differences between the device output paths.

FIGS. 15A and 15B illustrate another circuit consideration of the single-chip implementation, which is the distribution of chips' ground leads with respect to the output signal leads. In the context of the present discussion, "ground" is used to designate any device lead with a direct power or ground connection between the devices lead and the power and ground circuits of the chip associated with the output signal circuits of the chip. In FIGS. 15A and 15B, chip 1510 and 1520, respectively, comprises signals (e.g., SIG 1, 2, 3, 4) having signal outputs 1512.

The current into and out of each output signal device lead must return to or originate from the output circuits power supply or ground device leads labeled (GND). In the example of FIG. 15A, output signals SIG3 and SIG4 have close proximity to the ground pin (GND), while signals SIG1 and SIG2 have a greater distance from the ground pin (GND) and the path 1514 to ground or another such supply voltage 1515. Because any longer paths will have greater inductance between the ground lead and the output lead, there will be differences in any delay among the many non-uniformly implemented device output paths. In FIG. 15B, however, each output signal has a ground pin on both sides of it, resulting in uniform output signal inductance and thus, uniform delays.

Figure 16A:
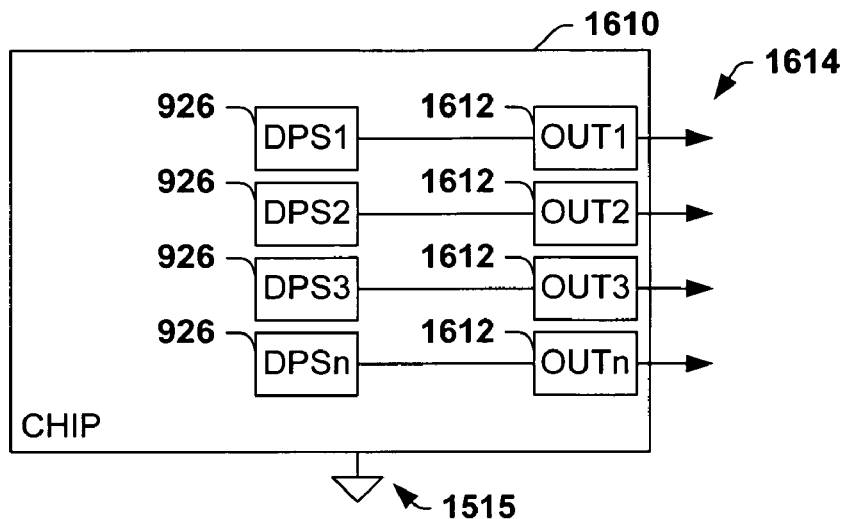
FIG. 16A is a schematic illustration of an exemplary single-chip DDS controller configuration, wherein each of the plurality of DPS circuits utilize a single ended output driver circuit configuration which is subject to cross-talk and phase error issues.

Finally, a third consideration of chip design to reduce inter-circuit phase error is the circuit configuration of the output driver circuit of the chip. FIG. 16A, for example, illustrates an exemplary single-chip DDS controller configuration 1610, wherein each of the plurality of DPS circuits 926 utilize a "single ended" output driver circuit 1612 configuration. As each output signal 1614 transitions from one logic state to the other and back (e.g., from 1 to 0, then back to 1), current flows into or out of the power and ground device leads 1515 of the device 1610.

Because these power and ground pins are shared and common to many or all output circuits on the chip 1610, and all device leads have some inductance, small perturbations will occur in all output signals due to changes on all other output signals. This "crosstalk" can manifest itself as a small phase error on each output that will vary depending on its phase relationship to all the other outputs taken individually and as a whole.

Figure 16B:
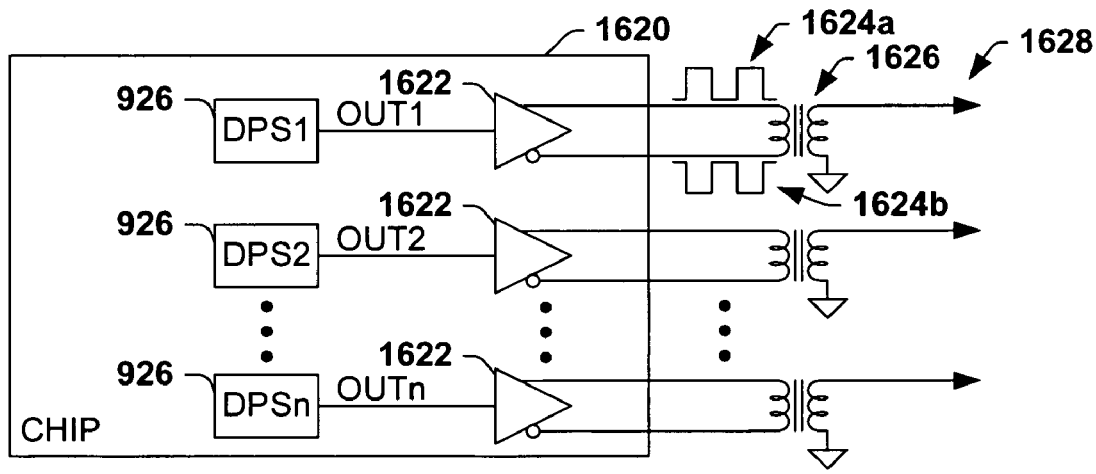
FIG. 16B is a schematic illustration of an exemplary single-chip DDS controller configuration, wherein each of the plurality of DPS circuits utilize a differential output driver circuit configuration which minimizes cross-talk and phase error issues.

FIG. 16B illustrates another exemplary single-chip DDS controller configuration 1620, wherein each of the plurality of DPS circuits 926 utilize a differential output driver circuit configuration 1622, which minimizes cross-talk and phase error issues. In principle, a differential output circuit 1622 provides a pair of differential outputs 1624a and 1624b that are identical in design, wherein one output delivers the logic output without inversion (e.g., 1624a), and the other output inverts the output signal (e.g., 1624b). A true differential output circuit implementation will cause the output signals 1624a/1624b to change nearly simultaneously on both the non-inverting output 1624a and the inverting output 1624b. The result is that the output signal current flow into or out of the non-inverting output 1624a and device lead will be equal and opposite of the current flow out of or into the inverting output device lead. Therefore, the net output current change will be nearly zero, and therefore the "crosstalk" into the other signal outputs on the same chip will be minimized.

The differential output configuration 1620 of FIG. 16B further illustrates the use of a transformer 1626 that is used to convert the differential output signals into a new single-ended signal 1628. As this conversion is done outside the chip 1620, it can be implemented in a manner that assures negligible crosstalk with the other output signal circuits 926 and 1622. The most common type of cable utilized to transport the phase control output signal to the many electrode voltage phase control PLLs is "coaxial" cable, which is a single-ended medium that does not accommodate differential signals. Lastly, by utilizing a transformer whose primary is connected solely to the differential output device leads, the currents flowing on the non-inverting and the inverting signal output leads must necessarily be equal and opposite in polarity, assuring that the chip current cancels out in an optimum way.

Figure 17A:
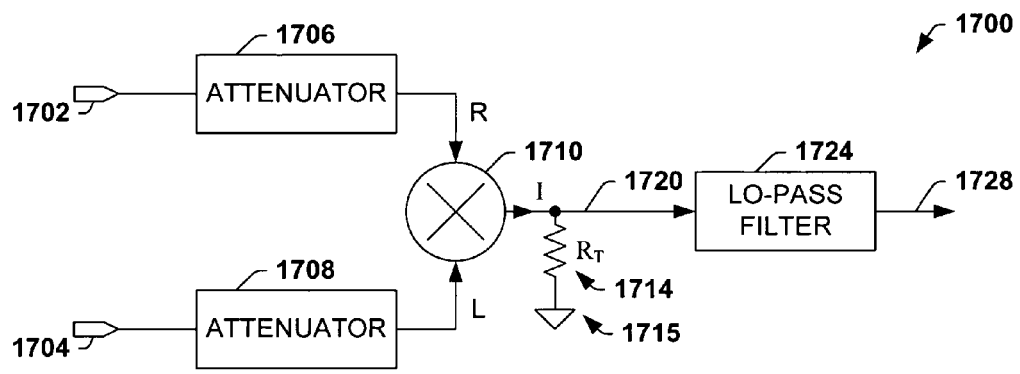
FIG. 17A is a schematic illustration of an exemplary phase detector circuit based on a double balanced mixer that may be used in accordance with an aspect of the invention.
Figure 17B:
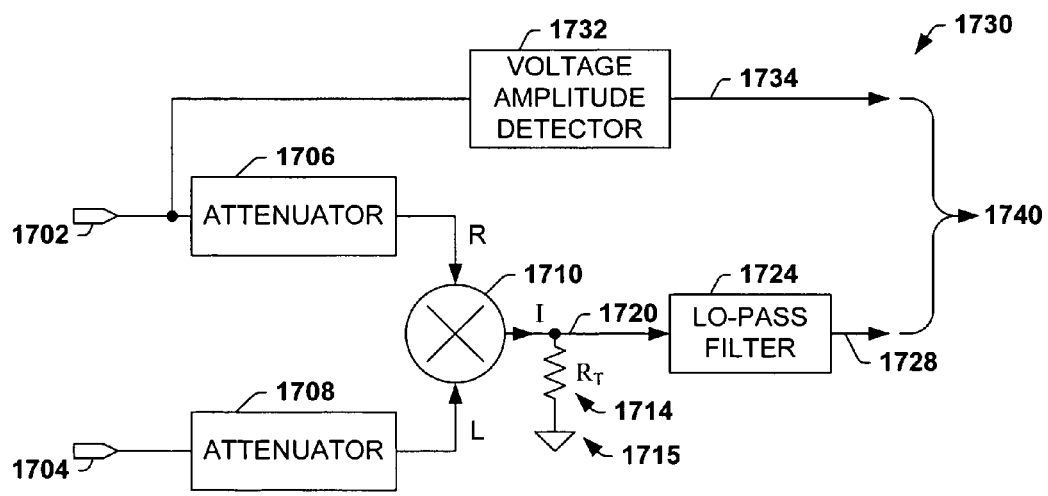
FIG. 17B is a schematic illustration of an exemplary electrode voltage amplitude and phase calibration circuit based on a double balanced mixer similar to that of FIG. 17A, and a voltage amplitude detector circuit used in accordance with the invention.

Referring now to FIGS. 17A and 17B, another aspect of the invention provides circuits and an improved method for phase calibration for LINAC systems used in ion implantation equipment. Upon reviewing the inter-electrode phase calibration method discussed previously, the observation method of the phase error during the calibration process is for a human test technician to visually observe the relationship between the reference phase and the electrode voltages phase as a waveform displayed on an oscilloscope. This necessarily introduces a small calibration error, when the technician views and interprets the relationship of each electrodes voltage phase in succession, one after the other. While this variation of signal interpretation may be small, it cannot be eliminated as long as it is a visual interpretation of a manual calibration operation.

In accordance with the present invention, an improved circuit embodiment replaces the oscilloscope with an electronic circuit whose output signal is a representation of the phase angle between the reference phase signal and the phase of the electrodes voltage being calibrated. In this exemplary embodiment, the phase detection circuit will have a preferred output signal voltage that represents a preferred input signal phase relationship at which systemic measurement errors (including variations in signal amplitude) are minimized.

FIG. 17A, for example, a circuit commonly known as a "double balanced mixer" (DBM) is used as a phase detector 1700. The phase detector 1700 compares the phase difference between an electrode voltage signal 1702 which is to be calibrated and input to attenuator 1706, to a reference phase signal 1704 input to attenuator 1708. When the frequency of both inputs of the RF port "R" and the local oscillator port "L" is identical, and when the signal voltages on the R and L ports are within the recommended signal values specified by the manufacture of the device (e.g., a commercially produced device is a type SRA-1, manufactured by Mini-Circuits, of Brooklyn, N.Y.), then the signal voltage on the intermediate frequency output "I" is:

"I" signal voltage~cosine (phase difference between ports R and L)·(signal amplitude at port R)   i)

When the phase of the signals on the R and L inputs differs by exactly 90 degrees, then the "I" signal voltage is zero, independent of the signal amplitude at the R input.

In the example of FIG. 17A, attenuating circuit elements 1706 and 1708 are located in both the "R" and "I" signal input paths 1702 and 1704, respectively, to assure that appropriate signal voltages are manifested at the "R" and "I" ports of a mixer 1710, and to reduce the amplitude of signal reflections in the "R" and "I" signal paths caused by any impedance mis-match caused by the non-linear behavior of the DBM circuit. The "I" output signal in this embodiment is terminated into a resistor $R_T$ 1714, whose value is approximately equal to the characteristic impedance of port "I" signal 1720 path (e.g., typically 50 ohms). The signal 1720 is then filtered by a low-pass filter 1724 to eliminate high frequency components associated with the "R" and "L" input frequency, its harmonics, and the instantaneous variations in phase that may be present in a system whose "L" reference signal (1702) and/or "R" electrode voltage signal (1704) is created by a circuit employing DDS and/or DPS methods.

The filtered output signal 1728 is measured by an analog-to-digital converter ADC, whose output signal is a numerical representation of the signal voltage at the output of the filter 1724. A computer based control system (not shown) receives the measured numeric value of the phase, and iteratively sends commands to the variable phase delay circuit element of the electrode control system whose phase is being calculated. By successively measuring the DBMs phase output signal and then adjusting the variable phase delay to the electrode being calibrated, the system can accurately identify the precise variable phase value that precisely results in a zero output signal. The corresponding value of the variable phase element is then stored into memory in the control system as the calibration value. Subsequently, this calibration value is utilized during normal (non-calibration) operation of the LINAC as an offset value to negate the otherwise uncompensated forward path phase delays in the electrodes voltage phase control system.

A DBM has an output voltage that is "zero" at both +90° and −90° (ie. 270°) phase angle between the R and L inputs of the mixer 1710. By monitoring the phase angle signal value together with the phase command sent to the variable phase element in the electrode's voltage phase control system, the computer software can be made to identify which polarity of "null" (zero) it is monitoring. In this way, the system may be designed to respond to only one polarity by adjusting the variable phase by 180 degrees, if necessary, to finally achieve a precise null at only one specified phase.

FIG. 17B illustrates an exemplary electrode voltage amplitude and phase calibration circuit 1730 similar to the double balanced mixer 1700 of FIG. 17A, which further includes a voltage amplitude detector circuit 1732 used in accordance with the invention. The voltage amplitude detector circuit 1732 is operable to provide an output signal 1734 that is uniformly and accurately related to the magnitude of the electrode voltage signal 1702 which is being calibrated.

Alternately, either separately or in combination with the electrode voltage phase signal 1728, the signal output 1734 of the voltage amplitude detector 1732 can be input to a computer measurement system 1740 (not shown), wherein an ADC converts the signal voltage into a numeric value. This numeric representation of the electrode voltage amplitude is utilized by the control system computer together with software instructions, to cause command signals to be sent to the electrode voltage amplitude control circuits. The process is repeated iteratively by successively reading the value of the voltage amplitude signal and then adjusting the value of the command sent to the electrode voltage amplitude control circuit, until a precise predetermined value of the electrode voltage amplitude signal is observed.

The values of the predetermined value of the electrode voltage amplitude (or electrode voltage amplitude "calibration point") and the value of the command that was computed to cause the system to precisely achieve operation at the calibration point are then used to compute one or more calibration values. These calibration values are then stored into the control system memory. During normal operation of the LINAC (non-calibration mode), these calibration values are retrieved by the system control software and used to adjust the commanded electrode voltage amplitude at each electrode to achieve a voltage amplitude whose value is very precisely related to the voltage amplitudes on the other LINAC electrodes.

The term "memory" as used herein may include but not be limited to such data storage elements as static or dynamic memory integrated circuits (ICs), disk drives including fixed and removable rotating magnetic or optic storage elements, FLASH memory, magnetic diskettes, tape, or their storage functional equivalent elements. Further, the term "software" includes information stored as firmware in devices such as memory ICs and programmable logic devices such as EPROMs, non-volatile RAM ICs, FLASH memory, diskettes, or EEPROM.

In summary: DDS is uniquely capable of providing the inter-tool dataset matching together with fast and accurate electrode-phase dataset changes, particularly during "chained" implant processes. The advantages of DDS for use in a production ion-implantation process tool can be better assured by incorporating an automated method of electrode voltage phase and amplitude calibration, to eliminate the "human factor" of measurement variations during the calibration process that minimizes machine-specific phase delay errors.

In one or more embodiments of the present invention (e.g., FIG. 2), the variable phase-delay elements 138 of the control system 130 for the LINAC 110 in the ion implantation machine 100 are implemented as a DDS, wherein a master oscillator signal 136 is derived from a digital frequency synthesis or DFS circuit element 134 which generates a continuous stream of n-bit binary values that represent the phase at each instant in time, of the desired LINAC operating frequency.

The frequency synthesis circuit is an accumulator circuit structure, wherein a clock signal (derived from the master oscillator) causes a register to store the current phase value, as n bits of data. This current phase value is summed with a usually fixed value (equal to the ratio of the desired LINAC operating frequency to the clock frequency applied to the register, also n bits in precision) and fed back into the register's input. Upon the next clocking of the register, the register's output signal stores a new value equal to the original phase value plus an additional phase angle equal to the ratio aforementioned, with a binary precision of n bits. As each successive clock signal is applied to the register, the output phase signal advances in phase by this same value. This signal is called the "master digital phase signal". The value of binary precision, n bits, is chosen to achieve the frequency accuracy required, and in one embodiment, for reasons of common circuit design methods, n is chosen to be 32, being implemented as four sets of 8-bit circuit elements, which exceeds the 26 bits minimum resolution desired for the LINAC in the ion implantation machine.

These phase values are applied to the input of several digital phase synthesis circuit elements, one of which is directly associated with the phase-control circuit path of one of the many RF (radio frequency) accelerating electrode voltages in the LINAC. These phase synthesis elements use a binary adder of m-bit precision, to add a phase offset to the master digital phase signal. The value of binary precision, m bits, is chosen to achieve the phase accuracy required for the particular LINAC system, and one embodiment, for reasons of common circuit design methods, m is chosen to be 16, being implemented as two sets of 8-bit circuit elements, which exceeds the 9 bits minimum resolution desired for the LINAC in the ion implantation machine.

The output of each digital phase synthesis element (the "electrode phase control" signal) is then applied as the input signal to the phase locked loop (PLL) circuit that causes the phase of the voltage at the LINAC electrode to be precisely controlled to match (or, "lock to") the value of the electrode phase control signal. In one embodiment, only the MSB (most significant bit) of the digital phase synthesis element is brought out from the circuit for use as the electrode phase control signal.

To minimize variations in phase delay between each of the several circuit paths of the digital phase synthesis circuits, due to such factors as variations in propagation delay of the many circuit elements and paths, due to power supply voltage variation, the temperature, and variation of the temperature of and between the many circuit elements, and aging of the many circuit elements, one implementation expresses several methods that may be individually or severally implemented.

These implementations achieve reduction of the variations in phase delay, including: causing the several circuits to be implemented into a single integrated circuit to reduce or eliminate the additional phase errors associated with the added PLL circuits required to synchronize a multi-chip implementation; causing the output of each phase-delay generating element within each chip to be so located within the chip so that the signal propagation delays between the internal phase-delay generating element and the device leads of the chip are most nearly equal in value.

Another phase delay improvement achieved by the present invention includes causing the many electrode phase control signals to be re-sampled into register circuits so located within the chip so that the signal propagation delays between the re-sampling circuit elements and the device leads of the chip are most nearly equal in value; and assigning the signal output device leads in a symmetrical manner with respect to the physical arrangement of the signal output device leads and the power supply and ground device leads that supply and return the current from each signal output circuit element, so that the mutual coupling of signal currents between the several device output leads is most nearly equal in value, and to cause the resulting phase errors among and between the several output circuit paths to be minimized.

Finally, the phase delay improvement achieved by the present invention includes using differential chip output circuit elements as superior to single-ended chip output circuit elements, to minimize phase errors due to cross-talk amongst the several chip output circuits due to the power supply and ground current circuit paths in common among the several outputs, and which common circuit paths have inductance which may increase said phase errors.

Even with the previously described circuit embodiments, the ability to transport and implement a dataset among two or more otherwise similar LINAC-based ion-implantation machines is affected by the accuracy with which the non-variant "static" component of the phase-errors of the many electrode voltages have been removed from the system by a calibration method. In another embodiment, the computer and software-based control system of the ion implantation machine are used together with a phase measurement circuit, to automate the calibration of each electrode's voltage phase. This embodiment thus reduces the required skill-set of the person performing the calibration, who would otherwise need to be knowledgeable in the operation of an oscilloscope or other phase-error measurement instrument to observe the phase error, and eliminates the human-factor of measurement error that occurs when the human makes an observation of the phase error and causes it to be entered into and retained by the control system as a calibration coefficient.

In another embodiment, the computer and software-based control system of the ion implantation machine are used together with an electrode voltage magnitude measurement circuit, to automate the calibration of each electrode's voltage amplitude. This amplitude measurement, either separately or simultaneously with the calibration of the electrode's voltage phase, again reduces the skills required and minimizes the errors that otherwise might occur due to manual interaction with the control system.

Thus, the invention provides significant improvement over conventional apparatus and methodologies for accelerating ions in an ion implantation system.

Although the invention has been shown and described with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention includes a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. An ion implanter comprising:
    an ion source adapted to direct charged ions having an initial mass and energy along a path;
    a mass analyzer downstream of the ion source for selecting ions based on the mass and energy of the ions;
    a multi-stage linear accelerator downstream of the mass analyzer comprising:
        a plurality of acceleration gaps; and
        a plurality of RF electrodes for accelerating the ions therebetween;
        wherein each stage of the multi-stage linear accelerator has at least one RF electrode and an acceleration gap adjacent to the electrode, and wherein each RF electrode is operatively associated with an accelerator energy source adapted to create an accelerating alternating electric field to accelerate the ions to a second energy;
    an end station adapted to position a workpiece so that the accelerated charged ions impact the workpiece; and
    a direct digital synthesis (DDS) controller coupled to the energy source and adapted to digitally synchronize a frequency and phase of the electric fields of each stage in the linear accelerator, the DDS controller comprising:
        a plurality of digital phase synthesis (DPS) circuits individually coupled to each of the plurality of RF electrodes to modulate the phase of the voltage applied to each RF electrode; and
        a digital frequency synthesis circuit (DFS) connected to each of the plurality of DPS circuits and adapted to digitally synthesize a master frequency and phase applied to each of the DPS circuits.

2. The ion implanter of claim 1, wherein the DDS controller further comprises a PLL connected between one of the plurality of DPS circuits and a corresponding one of the plurality of RF electrodes.

3. The ion implanter of claim 1, wherein the DDS controller further comprises a phase locked loop (PLL) connected between the master oscillator and one of the plurality of DPS circuits.

4. The ion implanter of claim 1, wherein each of the plurality of DPS circuits of the DDS controller further comprises a summation circuit adapted to receive a sample input and a phase offset value and connected to a digital storage register adapted to modulate the phase of the electric field applied to each RF electrode within a stage of the accelerator.

5. The ion implanter of claim 1, wherein the master oscillator (DFS) further comprises a digital accumulator and a look-up table adapted to digitally synthesize a master frequency and phase for each of the DPS circuits connected thereto, by reconstructing digitally calculated samples derived from the look-up table by correlating the phase of each sample to a corresponding voltage amplitude.

6. The ion implanter of claim 5, wherein the accumulator comprises a summation circuit adapted to receive a sample input and is connected to a digital storage register that is feedback connected to the summation circuit.

7. The ion implanter of claim 6, wherein the master oscillator (DFS) further comprises a plurality of phase shifter circuits adapted to digitally synthesize a master frequency and phase for each of the DPS circuits connected thereto comprising one of:
   a DFS circuit adapted to receive the master oscillator output frequency and a DPS circuit adapted to receive a phase offset value;
   a PLL circuit adapted to receive the master oscillator output frequency, a DFS circuit connected to the PLL circuit, and a first DPS phase offset circuit connected to the DFS circuit to produce a reference phase feedback connected to the PLL circuit, and a second DPS circuit connected to the DFS circuit and adapted to receive a phase offset input to produce a variable phase output to the RF electrode; and
   a summation circuit adapted to receive a phase offset value input and connected to a look-up table adapted to digitally synthesize a master frequency and phase for each of the DPS circuits connected thereto, by reconstructing digitally calculated samples derived from the look-up table by correlating the phase of each sample to a corresponding voltage amplitude.

8. The ion implanter of claim 1, wherein the DDS controller is configured such that the master oscillator and the DPS phase control circuits are centrally located within a single integrated circuit.

9. The ion implanter of claim 1, wherein the DDS controller is configured such that the DPS phase control circuits are centrally located within a single integrated circuit.

10. The ion implanter of claim 9, wherein the DPS phase control circuits are uniformly located for minimal delay variation at the perimeter of the integrated circuit.

11. The ion implanter of claim 10, wherein output registers of the DPS phase control circuits are uniformly located for minimal delay variation at the perimeter of the integrated circuit.

12. The ion implanter of claim 1, wherein the DDS controller is configured such that the DPS circuits are distributed locally to each stage of the accelerator, each stage comprising a PLL circuit adapted to receive the master oscillator output frequency, and a first DPS phase offset circuit connected to the PLL circuit to produce a reference phase feedback connected to the PLL circuit, and a second DPS circuit connected to the PLL circuit and adapted to produce a variable phase output to the RF electrode.

13. The ion implanter of claim 1, wherein the DDS controller is configured such that the DPS phase control circuits are centrally located within a single integrated circuit, and wherein the output signal terminals therefrom are uniformly spaced at the perimeter of the integrated circuit.

14. The ion implanter of claim 1, wherein the DDS controller is configured such that the DPS phase control circuits are centrally located within a single integrated circuit, and wherein the output signal terminals therefrom are uniformly spaced and are each located adjacent to a common ground or supply terminal at the perimeter of the integrated circuit.

15. The ion implanter of claim 1, wherein the DDS controller is configured such that the DPS phase control circuits are centrally located within a single integrated circuit, and wherein the DPS output signals comprise differential outputs from the integrated circuit.

* * * * *